(12) United States Patent
Boerstler

(10) Patent No.: US 6,819,728 B2
(45) Date of Patent: Nov. 16, 2004

(54) SELF-CORRECTING MULTIPHASE CLOCK RECOVERY

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 852 days.

(21) Appl. No.: 09/753,054

(22) Filed: Dec. 28, 2000

(65) Prior Publication Data

US 2002/0085658 A1 Jul. 4, 2002

(51) Int. Cl.[7] .................................................. H03D 3/24
(52) U.S. Cl. ........................ 375/376; 375/374; 370/518; 327/148; 327/157
(58) Field of Search ................................ 375/327, 371, 375/373, 374, 376; 370/516, 518; 327/144, 147, 148, 149, 156, 157, 158; 331/10

(56) References Cited

U.S. PATENT DOCUMENTS

| | | | |
|---|---|---|---|
| 4,669,024 A | | 5/1987 | Stacey |
| 4,819,251 A | * | 4/1989 | Nelson ........................ 375/373 |
| 5,436,939 A | | 7/1995 | Co et al. |
| 5,477,181 A | | 12/1995 | Li et al. |
| 5,550,515 A | | 8/1996 | Liang et al. |
| 5,684,805 A | * | 11/1997 | Brown ........................ 370/518 |
| 5,850,422 A | * | 12/1998 | Chen ........................... 375/371 |
| 5,886,552 A | * | 3/1999 | Chai et al. .................... 327/165 |
| 6,014,047 A | * | 1/2000 | Dreps et al. ................. 327/156 |
| 6,442,225 B1 | * | 8/2002 | Huang ........................ 375/376 |
| 6,560,306 B1 | * | 5/2003 | Duffy et al. ................. 375/376 |

OTHER PUBLICATIONS

U.S. patent application Ser. No. 09/753,055, David William Boerstler, filed Dec. 28, 2000.

"Dynamic Behaviour of a Phase Locked Loop Using D–Type Phase Detector and Non–Linear Voltage–controlled Oscillator" by David W. Boerstler, Data Systems Division, Kingston, NY 12401, 91A001478, TR–21.1428.

"A Self–Correcting Clock Recovery Circuit" by Charles R. Hogge, Jr., IEEE Journal of Lightwave Technology 1983+ UE, IEEE Journal of Lightwave Technology Issue vol. LT–3, Dec. 1985, pp. 1312–1314, 05W17, HDR 0020316.

"A 0.5 UM CMOS 4.0–Gbit/s Serial Link Transceiver with Data Recovery Using Oversampling" by Chih–Kong Ken Yang, Ramin Farjad–Rad, and Mark A. Horowitz, IEEE JSSC Issue vol. 33, No. 5, May 1998, 07T20, HDR 0020243.

"Single–Chip 1062 Mbaud CMOS Transceiver for Serial Data Communication" by John F. Ewen, Albert X. Widmer, Mehmet Soyuer, Kevin R. Wrenner, Ben Parker, Herschel A. Ainspan, ISSCC Digest Issue vol. 38, Feb. 1995, pp. 32–33, 07T20, HDR 0020244.

* cited by examiner

Primary Examiner—Young T. Tse
(74) Attorney, Agent, or Firm—Casimer K. Salys; Dillon & Yudell LLP

(57) ABSTRACT

A method of extracting a clock signal from a data stream, by generating a plurality of multiphase clock signals, creating error signals for each of the multiphase clock signals using the data stream, selecting at least one of the error signals based on retime state signals, correcting the multiphase clock signals using the error signal to produce corrected multiphase clock signals, and sampling the data stream using one of the corrected multiphase signals to produce a retimed data signal. The multiphase clock signals may be subharmonics of the data stream. In one embodiment, an UP error signal and a DN error signal are created for each of the multiphase clock signals, wherein the selecting step selects one of the UP error signals and one of the DN error signals, and the selected UP error signal and the selected DN error signal are applied to inputs of a charge pump to correct the clock signals. A multiphase voltage-controlled oscillator may be used to provide the multiphase clock signals. The retime state signals are defined using the synchronization states.

18 Claims, 26 Drawing Sheets

Fig. 1 *Prior Art*

| $Q_1$ | $Q_2$ | $Q_3$ | $Q_4$ | $Q_5$ | SynchState | RetimeState |
|---|---|---|---|---|---|---|
| X | 0 | 0 | 1 | 1 | 1 | 4 |
| 1 | X | 0 | 0 | 1 | 2 | 5 |
| 1 | 1 | X | 0 | 0 | 3 | 1 |
| 0 | 1 | 1 | X | 0 | 4 | 2 |
| 0 | 0 | 1 | 1 | X | 5 | 3 |

*Fig. 3*

| SynchState | $Q_1$ | $Q_2$ | $Q_3$ | $Q_4$ | $Q_5$ | Clock Late Wrt Data |
|---|---|---|---|---|---|---|
| 1 | (0) | 0 | 0 | 1 | 1 | 1 |
| 1 | (1) | 0 | 0 | 1 | 1 | 0 |
| 2 | 1 | (0) | 0 | 0 | 1 | 1 |
| 2 | 1 | (1) | 0 | 0 | 1 | 0 |
| 3 | 1 | 1 | (0) | 0 | 0 | 1 |
| 3 | 1 | 1 | (1) | 0 | 0 | 0 |
| 4 | 0 | 1 | 1 | (0) | 0 | 1 |
| 4 | 0 | 1 | 1 | (1) | 0 | 0 |
| 5 | 0 | 0 | 1 | 1 | (0) | 1 |
| 5 | 0 | 0 | 1 | 1 | (1) | 0 |

*Fig. 4*

SELF-CORRECTING MULTIPHASE CLOCK RECOVERY

CROSS-REFERENCE TO RELATED APPLICATION

This application is related to U.S. patent application Ser. No. 09/753,055 entitled "MULTIPHASE CLOCK RECOVERY USING D-TYPE PHASE DETECTOR", filed concurrently with this application, which is hereby incorporated.

BACKGROUND OF THE INVENTION

1. Field of the Invention

The present invention generally relates to electronic clock circuits, specifically to a method and system for providing clock recovery from a high-frequency data signal, and more particularly to such a method and system that has reduced power dissipation, and acceptable cycle variation (jitter).

2. Description of Related Art

Electronic circuits that provide clock signals are used in a wide assortment of devices, and particularly in computer systems. Microprocessors and other computer components, such as random access memory (RAM), device controllers and adapters, use clock signals to synchronize various high-speed operations. These computer clock circuits often use a phase-lock loop (PLL) circuit to synchronize (deskew) an internal logic control clock with respect to an external system clock.

A typical prior art PLL circuit 1 is shown in FIG. 1 and includes a phase/frequency detector (PFD) 2, a charge-pump 3, a low-pass filter 4, and a voltage-controlled oscillator (VCO) 5. Phase/frequency detector 2 compares two input signals, a reference signal $f_{ref}$ (from the external system clock) and a feedback signal $f_{fb}$, and generates phase error signals that are a measure of the phase difference between $f_{ref}$ and $f_{fb}$. The phase error signals ("UP" and "DOWN") from detector 2 are used to generate control signals by charge-pump 3 which are filtered by low-pass filter 4 and fed into the control input of voltage-controlled oscillator 5. Voltage-controlled oscillator 5 generates a periodic signal with a frequency which is controlled by the filtered phase error signal.

The output of voltage-controlled oscillator 5 is coupled to the input $f_{fb}$ of phase/frequency detector 2 directly or indirectly through other circuit elements such as dividers 6, buffers (not shown) or clock distribution networks (not shown), thereby forming a feedback loop. If the frequency of the feedback signal is not equal to the frequency of the reference signal, the filtered phase error signal causes the frequency of voltage-controlled oscillator 5 to shift (upwards or downwards) toward the frequency of the reference signal, until voltage-controlled oscillator 5 finally locks onto the frequency of the reference; following frequency acquisition, phase acquisition is achieved in a similar manner. The output of voltage-controlled oscillator 5 is then used as the synchronized signal (for internal logic control).

In cases where the incoming data is a self-clocking bit stream, the comparator system may be used to extract (recover) the clock information from the data stream itself. Clock extraction for high-speed serial links is usually accomplished using a VCO with a center frequency N for extracting a clock from a serial data stream modulated at N bits/sec. The VCO may provide multiple phases for oversampling, as discussed in the article by Yang, et al., "A 0.5 um CMOS 4.0 Gbit/s Serial Link Transceiver with Data Recovery Using Oversampling," IEEE JSSC Vol 33, No. 5 (May 1998), or more commonly offer just a single phase for direct detection. An example of a single phase D-type phase detector technique used for non-return-to-zero (NRZ) data is disclosed in the article by Boerstler, "Dynamic Behavior of a Phase-Locked Loop Using D-Type Phase Detector and Nonlinear Voltage-Controlled Oscillator", IBM Technical Report TR 21.1428 (Mar. 21, 1991).

For high-bandwidth applications such as in packet switches, maximizing both frequency and density simultaneously is desired, but this causes power dissipation and/or power density to be a significant problem. CMOS technology limitations can also limit the speed at which clock recovery can be accomplished, and operating the clocks at one-half the baud rate has been reported, as in Ewen et al., "Single-Chip 1062 Mbaud CMOS Transceiver for Serial Data Communication," ISSCC Digest, Vol 38, pp. 32–33 (February 1995).

In light of the foregoing, it would be desirable to devise an improved method for recovering a high-speed clock from a data signal. It would be further advantageous if the method were to result in reduced power dissipation, while still ensuring acceptable levels of jitter.

SUMMARY OF THE INVENTION

It is therefore one object of the present invention to provide an improved clock circuit, such as may be used with a microprocessor or other high-performance computer components.

It is another object of the present invention to provide such a clock circuit which is able to extract a clock signal from a data stream having a high data rate.

It is yet another object of the present invention to provide a method of recovering clock signal from a data stream which results in decreased power dissipation as compared to the prior art.

The foregoing objects are achieved in a method of extracting a clock signal from a data stream, generally comprising the steps of generating a plurality of multiphase clock signals, creating a plurality of error signals, at least one error signal for each of the multiphase clock signals, using the data stream, selecting at least one of the error signals based on a plurality of retime state signals, correcting the multiphase clock signals using the at least one error signal to produce corrected multiphase clock signals, and sampling the data stream using one of the corrected multiphase signals to produce a retimed data signal. The multiphase clock signals may be subharmonics of the data stream. In one embodiment, an UP error signal and a DN error signal are created for each of the multiphase clock signals, wherein the selecting step selects one of the UP error signals and one of the DN error signals, and the selected UP error signal and the selected DN error signal are applied to inputs of a charge pump to correct the clock signals. A multiphase voltage-controlled oscillator may be used to provide the multiphase clock signals. The retime state signals are defined using the synchronization states.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIG. 3 is a table illustrating synchronization and retiming state identification information used according to the present invention;

FIG. 4 is a table illustrating how the timing correction (early/late) is determined in accordance one implementation of with the present invention which uses a D-type phase detector;

DESCRIPTION OF AN ILLUSTRATIVE EMBODIMENT

The present invention provides an improved method and system for extracting a clock signal from a serial data stream. In one embodiment, the invention uses a multiple-phase subharmonic clock from a non-return-to-zero (NRZ) stream to retime and deserialize the data. In particular, the implementations described below use a 5-phase one gigahertz (GHZ) voltage-controlled oscillator (VCO), and either a 5-phase D-type phase detector or a 5-phase self-correcting phase detector configured in a phase-lock loop (PLL), to recover the clock and retime a 5 gigabit per second NRZ data stream. Those skilled in the art will appreciate, however, that the specific implementations disclosed herein are not to be construed in a limiting sense. For example, the invention could be used for clock reduction factors other than 5, e.g., 7, 9, 11, etc., for single-rail rings oscillators, or 4, 6, 8, etc., for differential ring oscillators, or 4 for quadrature oscillators.

Figure 1:
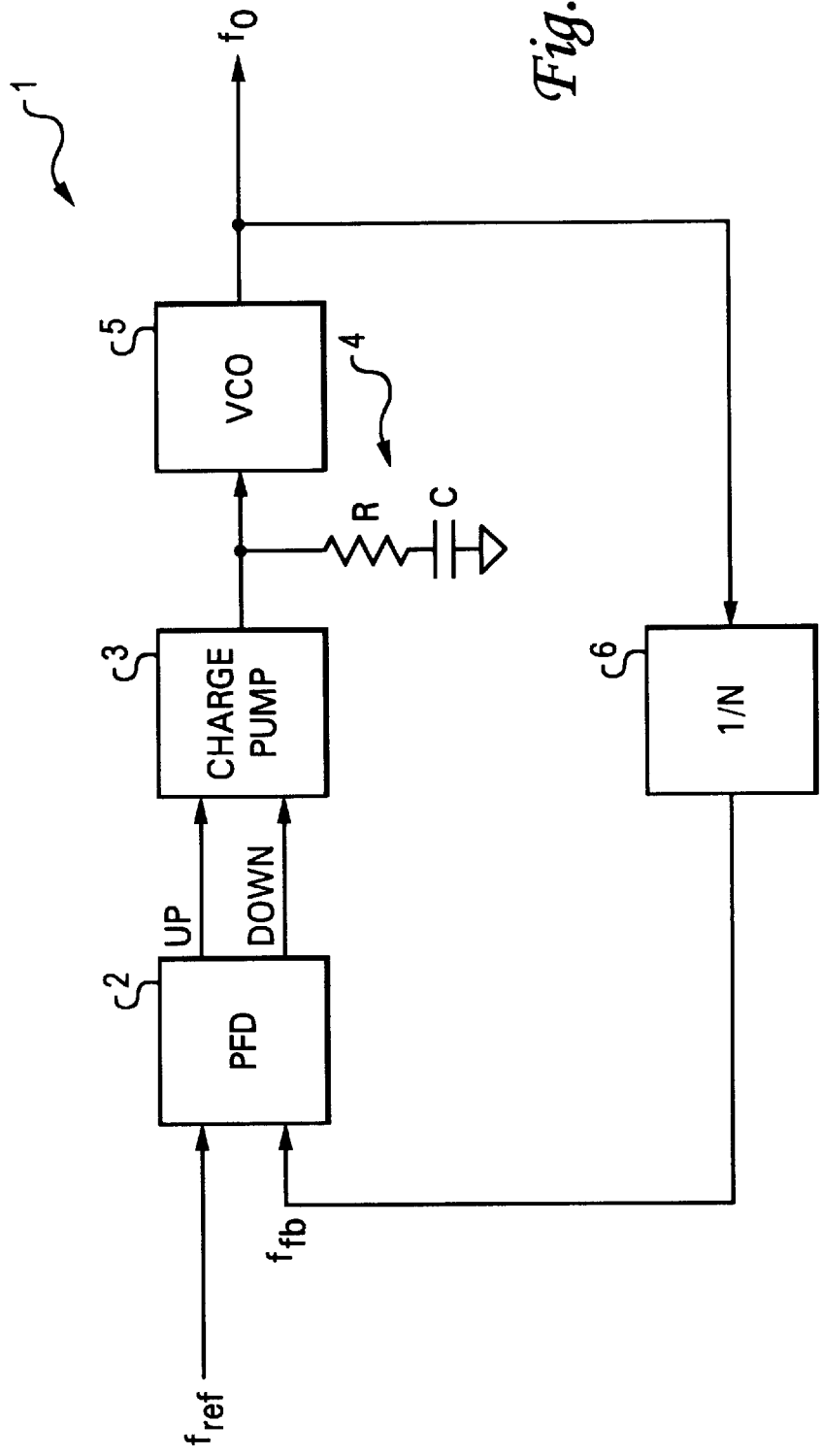
FIG. 1 is a block diagram illustrating a conventional phase-lock loop.
Figure 2:
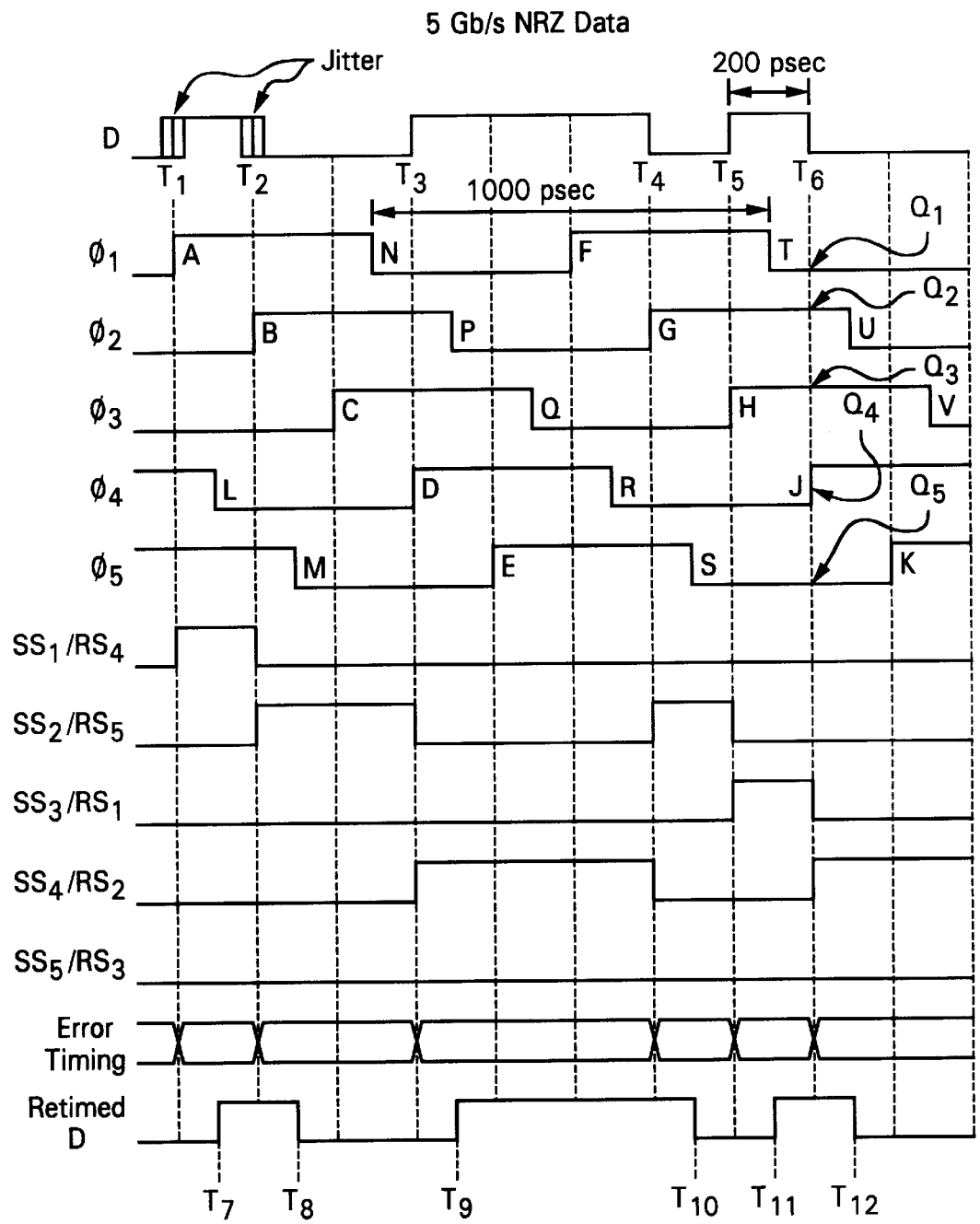
FIG. 2 is timing diagram illustrating synchronization and retiming in one implementation of the present invention using a multiphase voltage-controlled oscillator (VCO) and a D-Type phase-frequency detector.

With reference now to the figures, and in particular with reference to FIG. 2, there is depicted a timing diagram for the 5 Gb/s NRZ data stream implementation of the invention. Five clock phases are available from a multiphase VCO operating at one GHz. An appropriate multiphase VCO is disclosed in copending U.S. patent application Ser. No. 09/726,282 filed on Nov. 30, 2000, and entitled "A HIGH-FREQUENCY LOW-VOLTAGE MULTIPHASE VOLTAGE-CONTROLLED OSCILLATOR," now U.S. Pat. No. 6,559,729B2, which is which is hereby incorporated. The clock phases are separated equally and duty cycle is 50% for each phase. Input data has timing jitter on all edges which has a distribution around the mean time values $T_1, T_2, \ldots, T_n$.

Five synchronization states ($SS_1$–$SS_5$) are shown in FIG. 2, defining which of the rising edges of the five clock phases is most closely aligned with the edges (positive or negative) of data signal D at any given point in time. $SS_1$ is asserted at time $T_1$ since the first phase signal $\emptyset_1$ (at A) is in alignment, and is deasserted at time $T_2$ since second phase signal $\emptyset_2$ (at B) becomes aligned and $SS_2$ is asserted. $SS_2$ stays asserted during the period from time $T_2$ to time $T_3$, when no transitions in the data are present, and deasserts when $SS_4$ is asserted due to the fact that the fourth phase signal $\emptyset_4$ (at D) is aligned with time $T_3$. Some synchronization states might not be asserted for brief periods of time due to data transitions and the currently established timing relationships (e.g., $SS_5$ in FIG. 2). Data is retimed (sampled in the middle of the "eye" for optimum bit error rate (BER)) by choosing the clock phase appropriate for the current synchronization state ("SynchState"). Data is sampled at time $T_7$ by $\emptyset_4$ (at L) since the current SynchState is 1, i.e., the condition of SynchState=1 defines RetimeState=4 ($RS_4$). Similarly, $SS_2$, $SS_3$, $SS_4$, and $SS_5$ define the retime states $RS_5$, $RS_1$, $RS_2$, and $RS_3$, respectively.

FIG. 3 shows a table which is used to determine the current SynchState and RetimeState from serial data sampling the clocks. Transitions in the data (both positive and negative) are used to sample all five phases of the clock and are held as binary values $Q_1$–$Q_5$ for $\emptyset_1$–$\emptyset_5$, respectively. The "X" values in the table of FIG. 3 are examined to generate the error signal for the PLL, according to the second table shown in FIG. 4 (for the D-type detector implementation of the present invention). For example, if SynchState=1, then a zero value for $Q_1$ indicates that the clock is late ("Clock Late wrt Data" value of 1), while a one value for $Q_1$ indicates that the clock is early ("Clock Late wrt Data" value of 0). The timing of the error signals is shown in FIG. 2, where the clocks are determined to be either early or late with respect to the data (for the D-type detector implementation of the present invention). Data sampling the clocks is illustrated in FIG. 2 at time $T_6$, where the sampled values of $\emptyset_1$–$\emptyset_5$ are latched to create values $Q_1$–$Q_5$ as shown in the timing diagram. The values of $Q_1$–$Q_5$ at $T_6$ correspond to SynchState=4 and RetimeState=2, shown in FIG. 2 becoming asserted at $T_6$, while the previous SynchState and RetimeState become deasserted ($SS_3$/$RS_1$).

The clocks sample the data signal to retime the data. FIG. 2 illustrates how the negative transition of the appropriate clock phase is used to sample the data in the center of the bit interval. For example, during the period from $T_4$ to $T_5$, SynchState=2 and RetimeState=5 are asserted; therefore the negative edge of $\emptyset_5$ samples the data at $T_{10}$, resulting in the retimed data signal (Retimed D) changing to a low state. In general, for RetimeState=n (n=1 ... 5), a negative transition of $\emptyset_n$ samples D, and a positive transition of $[1+\text{mod}_5(\emptyset_{n+2})]$ samples $SD_n$ (the sampled data from $\emptyset_n$): a negative transition of $\emptyset_1$ samples D, positive transition of $\emptyset_4$ samples $SD_1$; a negative transition of $\emptyset_2$ samples D, positive transition of $\emptyset_5$ samples $SD_2$; a negative transition of $\emptyset_3$ samples D, positive transition of $\emptyset_1$ samples $SD_3$; a negative transition of $\emptyset_4$ samples D, positive transition of $\emptyset_2$ samples SD4; and a negative transition of $\emptyset_5$ samples D, positive transition of $\emptyset_3$ samples $SD_5$.

Figure 5:
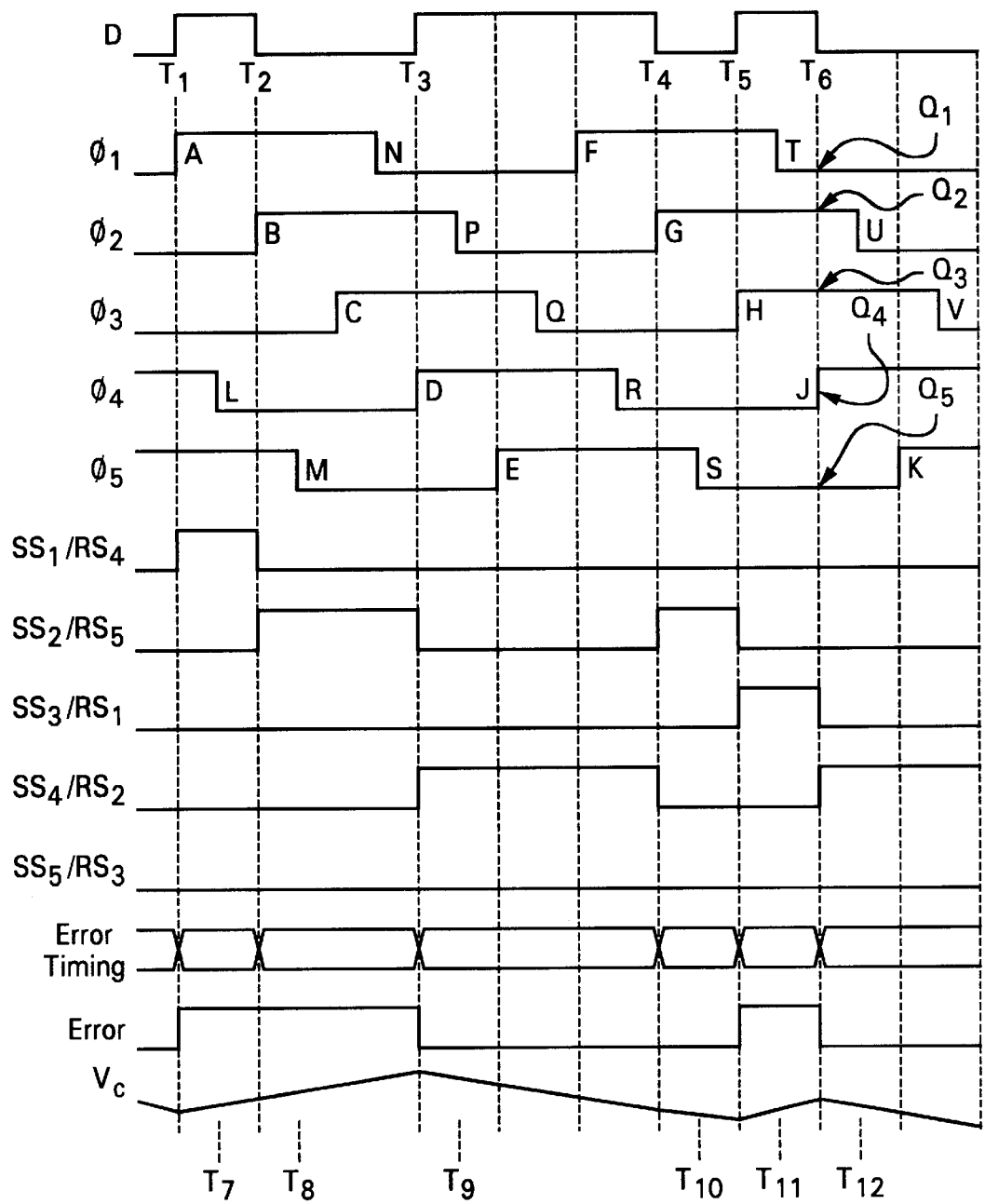
FIG. 5 is a timing diagram illustrating the multiphase clock signals and synchronization states with clock and data aligned, for the D-type phase detector implementation.

FIG. 5 shows a timing example for the condition wherein the clocks are generally aligned with the data, for the D-type detector implementation of the present invention. An error signal is generated which becomes asserted at time $T_1$ due to $\emptyset_1$ being late with respect to the rising edge of the data D for $SS_1$ asserted. The error remains high at time $T_2$ since $\emptyset_2$ is late with respect to the negative edge of D for $SS_2$ asserted. At time $T_3$ SynchState=4, $\emptyset_4$ leads D, and the error signal deasserts. At time $T_4$ ($SS_2$) $\emptyset_2$ leads D and the error stays low, at time $T_5$ ($SS_3$) $\emptyset_3$ lags D and error asserts, and at time $T_6$ ($SS_4$) $\emptyset_4$ leads D and error deasserts. Since the phase detector has the characteristics of a D-type flip-flop, it responds ideally to infinitesimal phase differences between the clock and the data. When the PLL is in steady-state, the average value of the error signal is 50% of the logic swing for random input data. The error signal is integrated by a charge pump or filter circuit to produce the control voltage ($V_c$) for the VCO (discussed further below). The control voltage causes the VCO frequency to increase ($V_c$ increasing) or decrease ($V_c$ decreasing) to correct for the error.

Figure 6:
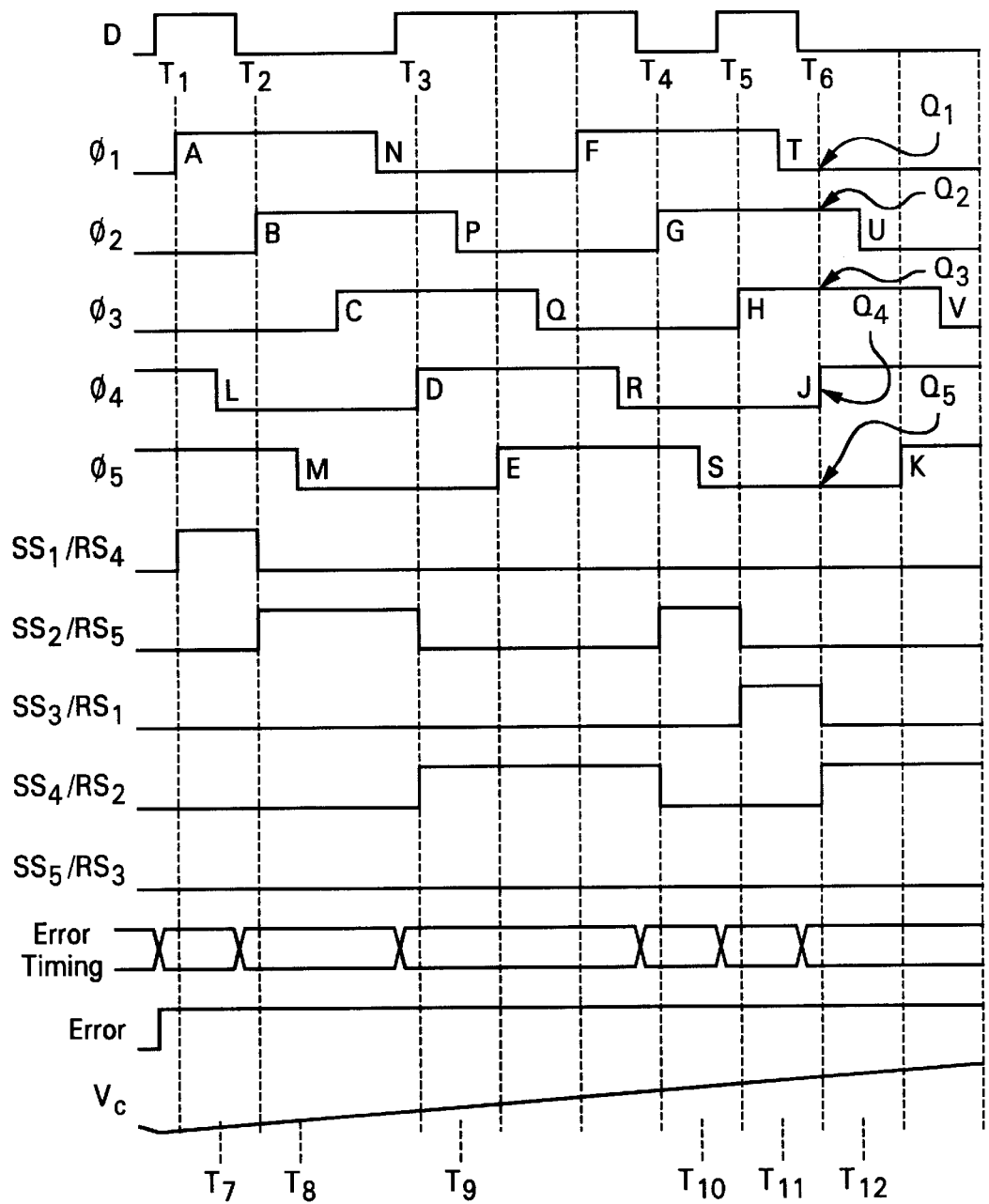
FIG. 6 is a timing diagram illustrating multiphase clock signals and synchronization states where the clock lags the data signal, for the D-type phase detector implementation.
Figure 7:
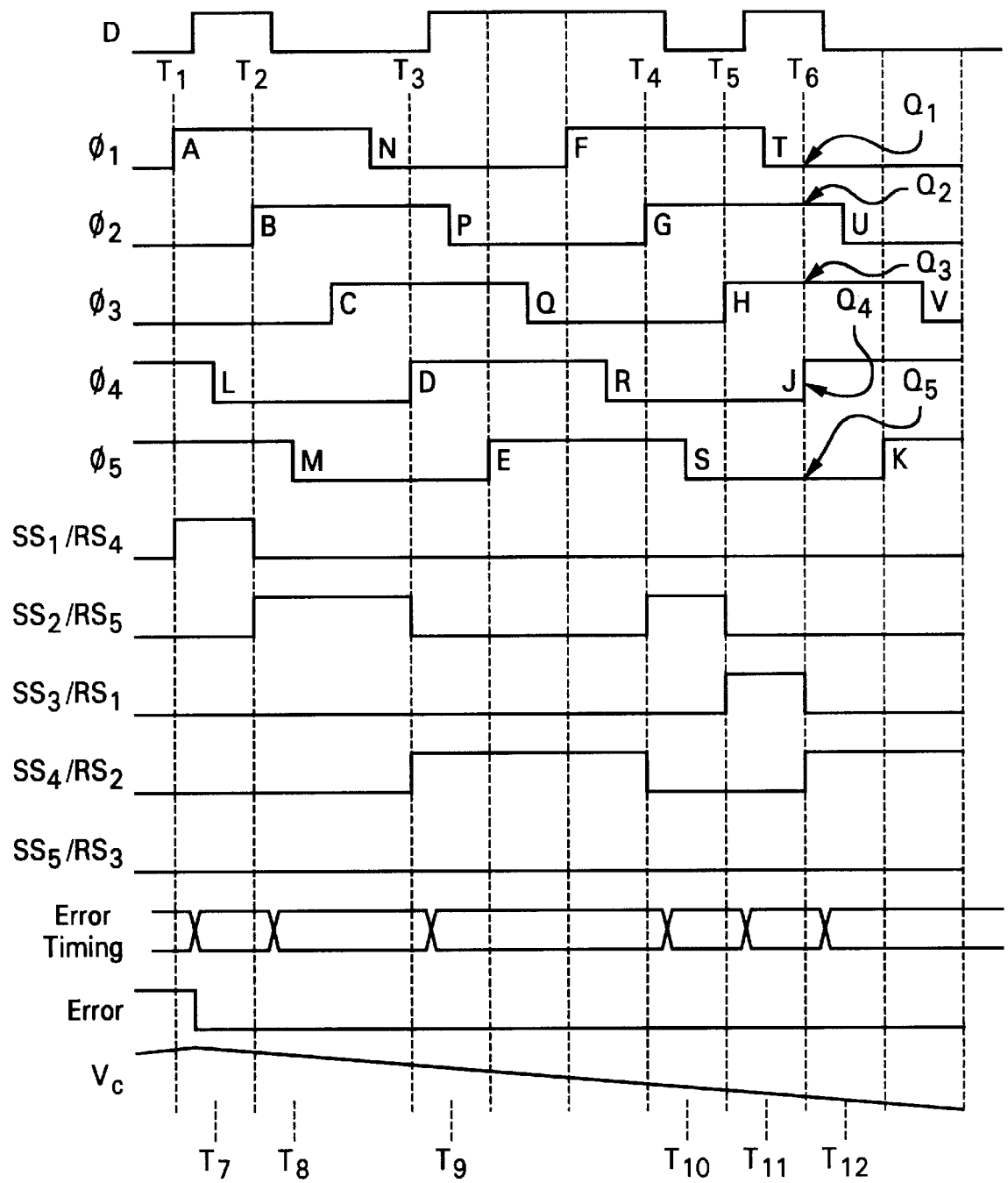
FIG. 7 is a timing diagram illustrating the multiphase clock signals and synchronization states when the clock leads the data signal, for the D-type phase detector implementation.

FIG. 6 shows the timing for the clock lagging the data. The average value of the error signal rapidly increases for this condition, causing the VCO frequency to increase rapidly. Similarly, FIG. 7 shows a corresponding rapid decrease in the average value of the error signal for the clock leading the data, forcing the frequency of the VCO rapidly lower. Very rapid PLL acquisition is a consequence of this phenomena, but increased jitter caused by overcorrection during missing transitions may also occur.

Figure 8:
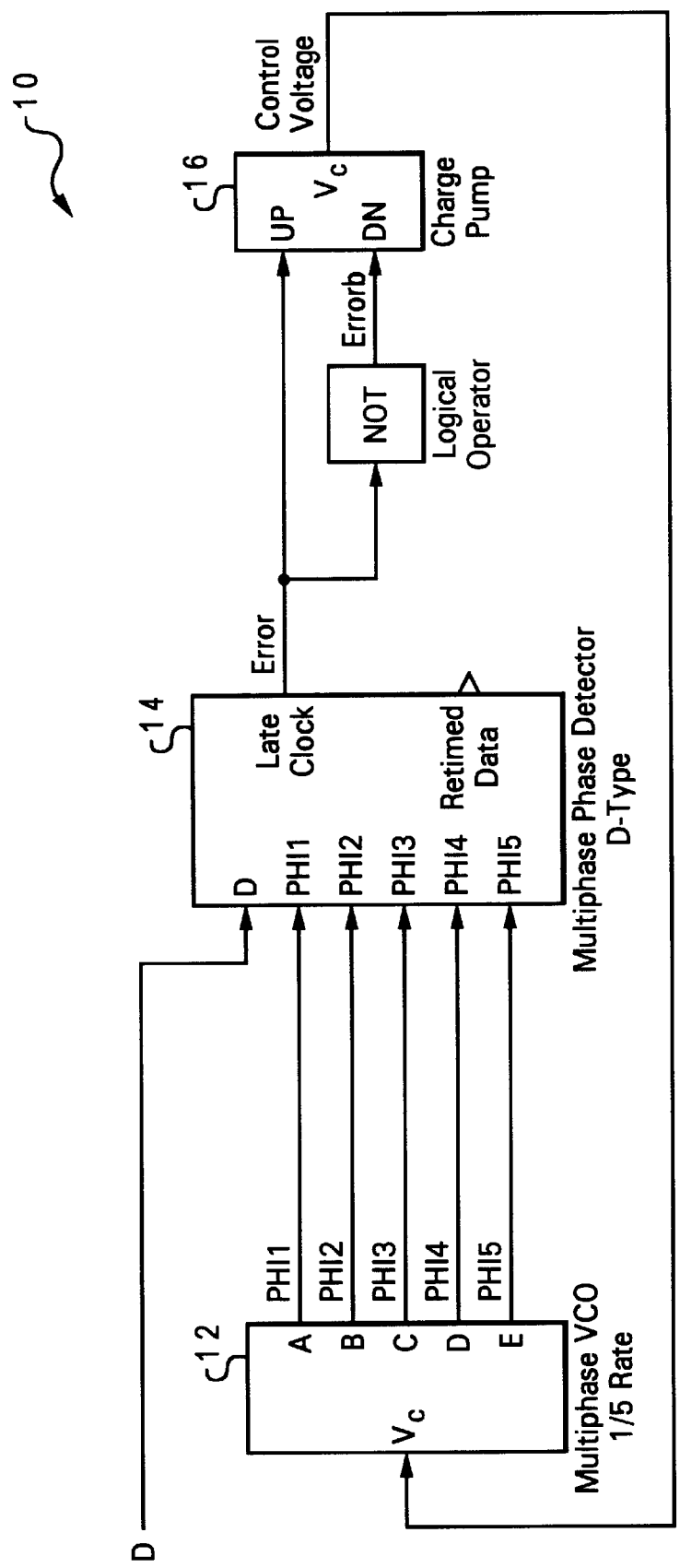
FIG. 8 is a block diagram illustrating a multiphase phase-lock loop using a D-type phase detector in accordance with one embodiment of the present invention.

FIG. 8 is a block diagram depicting a multiphase PLL 10 which implements the foregoing embodiment of the invention. An NRZ data stream is presented at the input to PLL 10. A 5-phase VCO 12 operating at one GHz is connected to a D-type multiphase phase detector 14 which includes a retiming function. D-type multiphase phase detector 14 thus receives each of the signals $\emptyset_1$–$\emptyset_5$, as well as the data signal, and outputs a late clock error signal to a conventional charge-pump 16. Charge-pump 16 creates a control (feedback) voltage for VCO 12 from the error signal.

Figure 9:
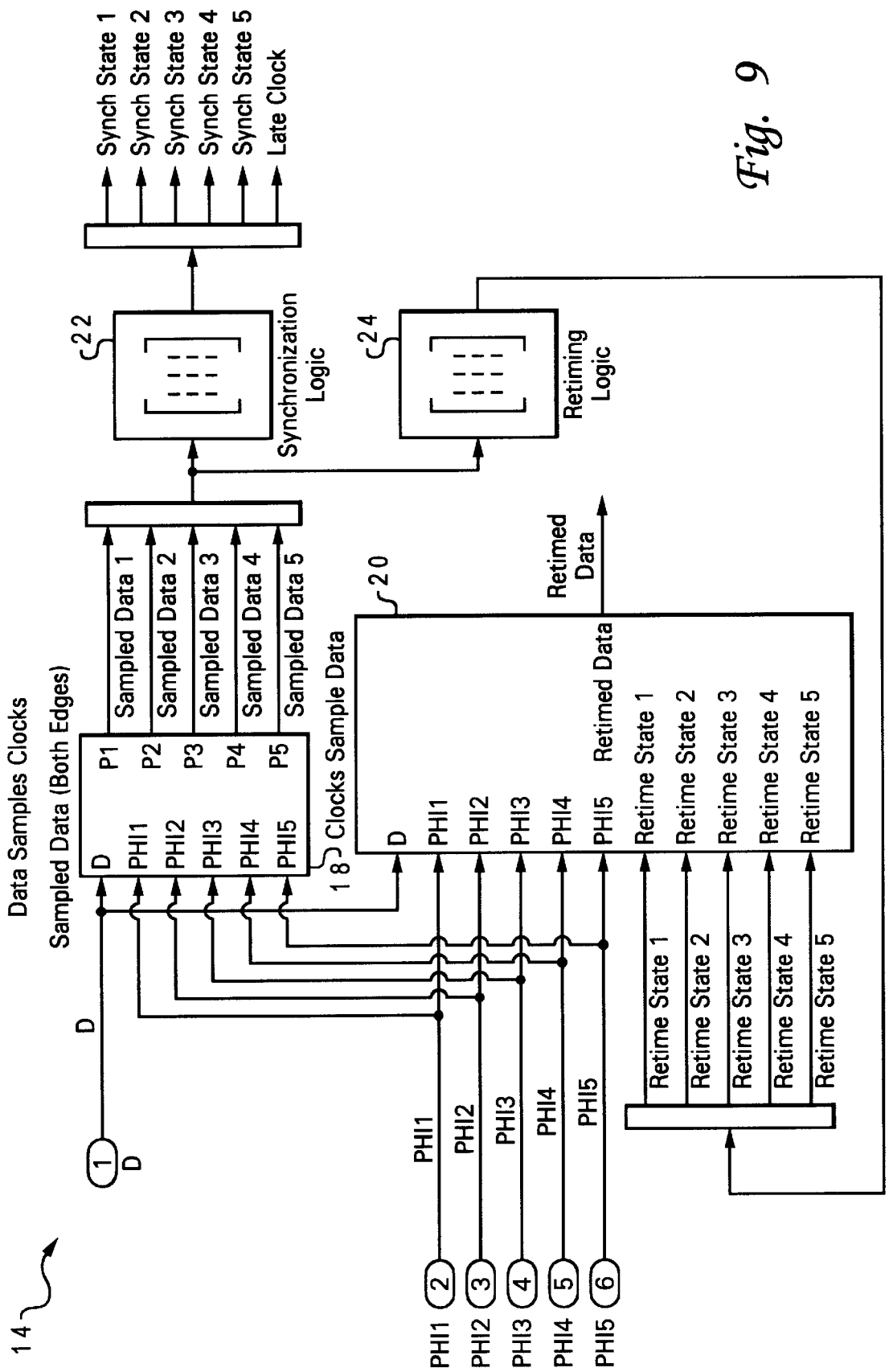
FIG. 9 is a block diagram of the multiphase phase detector used in the phase-lock loop of FIG. 8.

FIG. 9 is another block diagram depicting the high-level organization of D-type multiphase phase detector 14. D-type multiphase phase detector 14 is comprised of a sampled clock unit 18, a retime latch 20, synchronization logic 22, and retiming logic 24. Sampled clock unit 18 receives the data and five clock signals, and uses both edges of the data to sample the clocks. Retime latch 20 receives these inputs as well, and uses the clocks to sample the data to create retimed data. Synchronization logic 22 generates the SynchStates according to the table of FIG. 3, and provides the late clock signal. Retiming logic 24 generates the RetimeStates according to the table of FIG. 4, and provides those states to retime latch 20.

Figure 10:
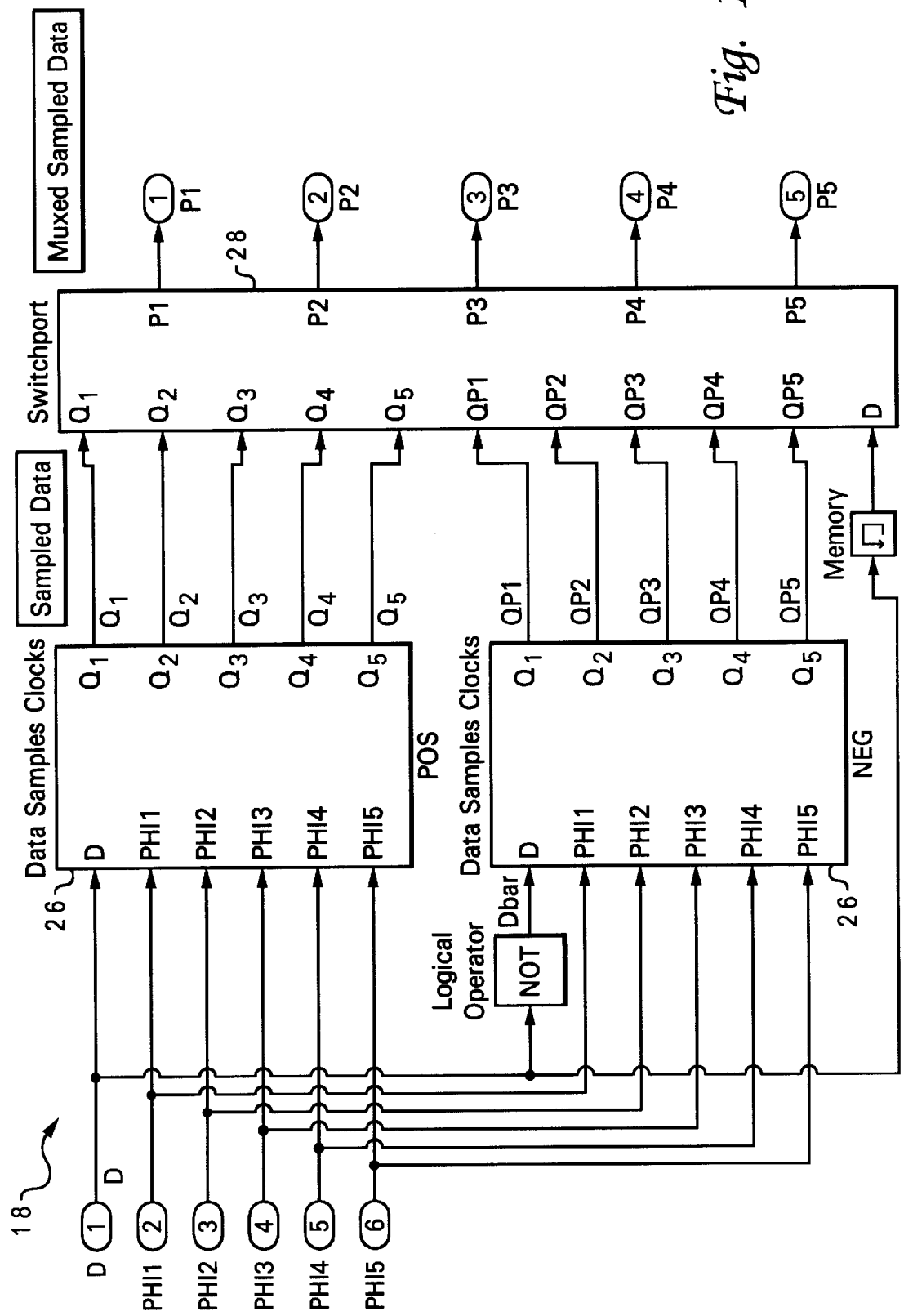
FIG. 10 is a block diagram of the sampled clock unit used in the multiphase phase detector of FIG. 9.
Figure 11:
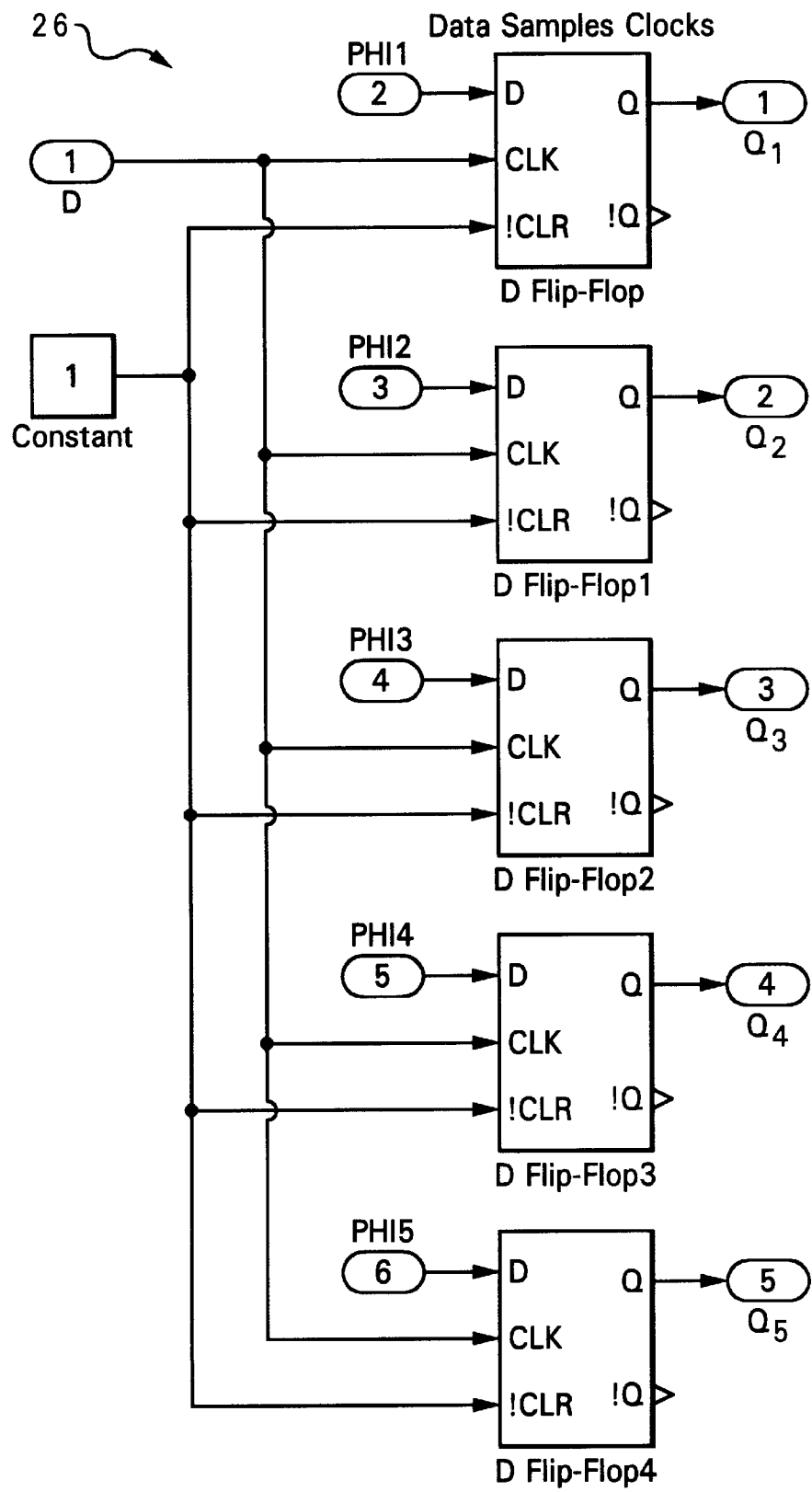
FIG. 11 is a block diagram illustrating a latch array used to sample the clock signals, in the sampled clock unit of FIG. 10.
Figure 12:
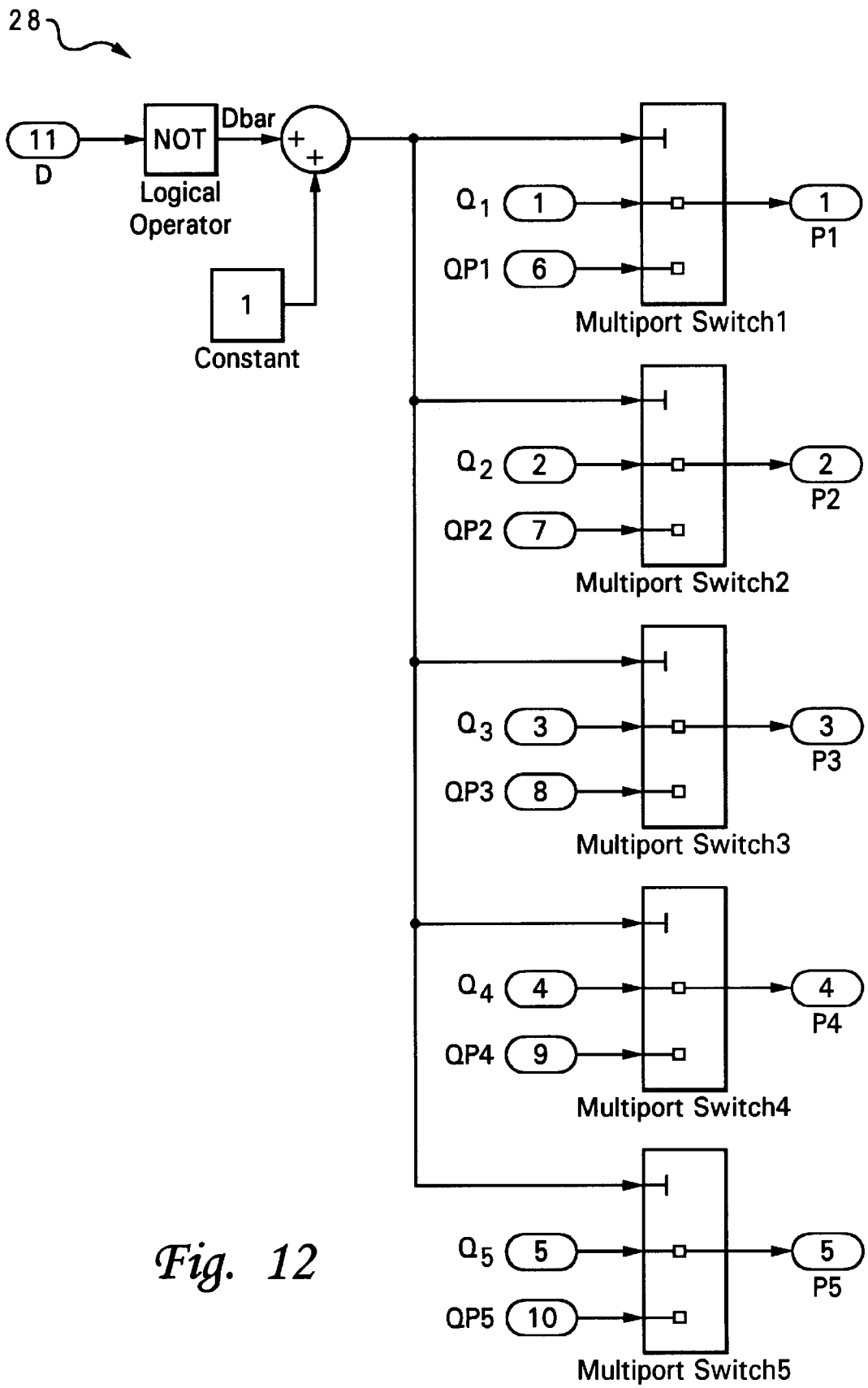
FIG. 12 is block diagram of a switchport (multiplexor) used by the sampled clock unit of FIG. 10.

FIG. 10 illustrates exemplary components of sampled clock unit 18. Two sets of latch arrays 26 sample the clocks from the data signal to provide the latched values (a suitable latch configuration is shown in FIG. 11). A switchport 28 (essentially a multiplexor, see FIG. 12) selects from among the inputs provided by the flip-flop arrays to output the appropriate data samples $P_1$–$P_5$, which are then provided to synchronization logic 22 and retiming logic 24 (the "Q" values in FIGS. 3 and 4).

Figure 13:
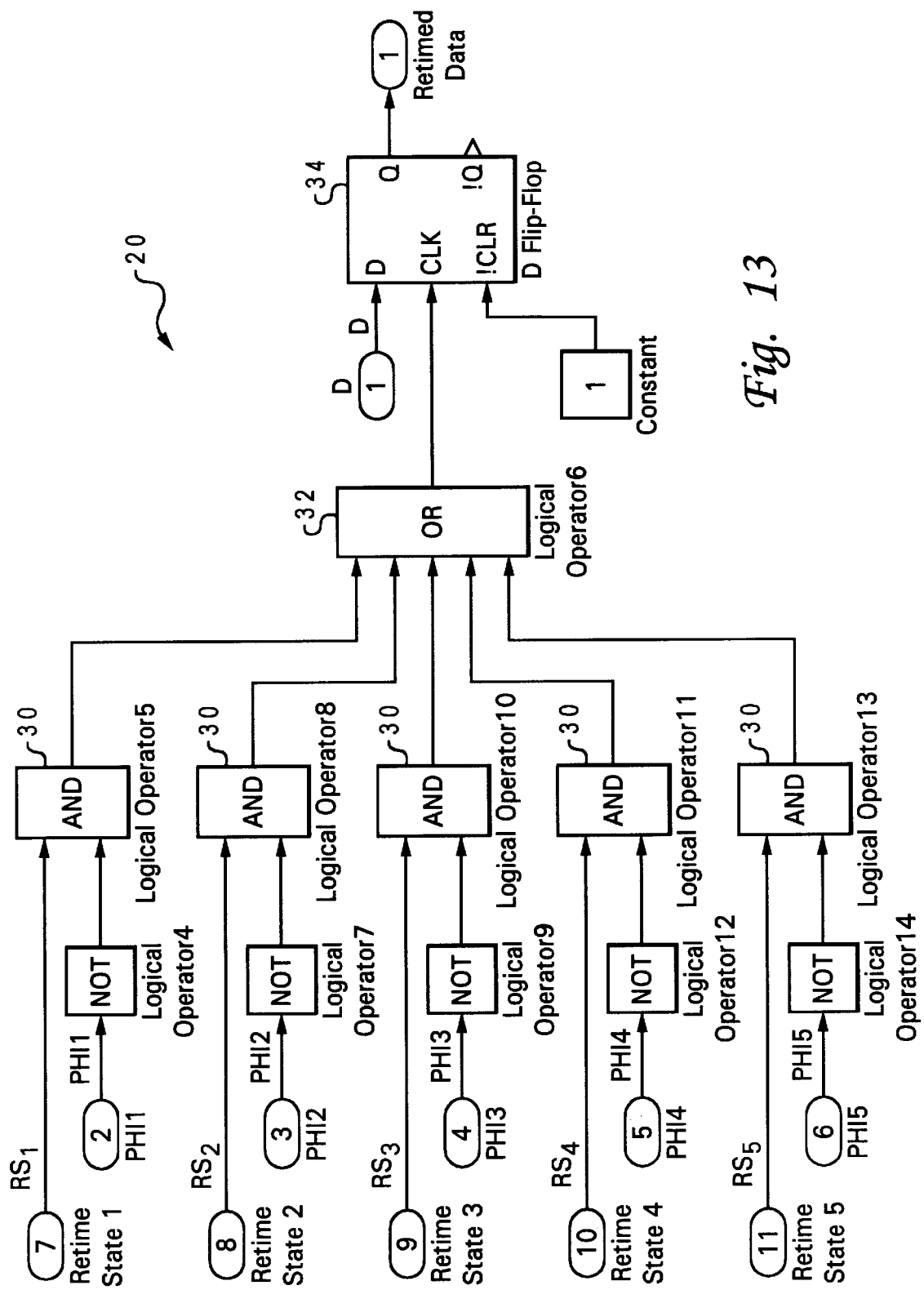
FIG. 13 is a block diagram illustrating the retime latch of FIG. 9.

FIG. 13 illustrates exemplary details of how retime latch 20 selects the appropriate phase for capturing the data. The phase is selected by combining respective pairs of retime state signals and inverted phase signals using AND gates 30, and further combining the outputs of AND gates 30 using a 5-input OR gate 32. A D-type flip-flop 34 latches the output of OR gate 32 using the original data signal, to produce the retimed data signal.

Simulations of the foregoing design for PLL 10 demonstrate that phase acquisition time is more than an order of magnitude faster than that for alternate PLL designs. Operating the PLL at lower speeds saves power, allowing higher densities, and makes less-advanced technologies viable alternatives. The use of a D-type phase detector offers not only significantly reduced acquisition times, but also lower complexity, and less power dissipation. D-type phase detectors may require aided frequency acquisition or reduced VCO range to avoid lock at undesired harmonics of the serial data, and may have higher steady-state jitter for low data transition density. Other devices may be used to provide the on/off functionality of the early/late detection, such as a saturating amplifier.

Figure 14:
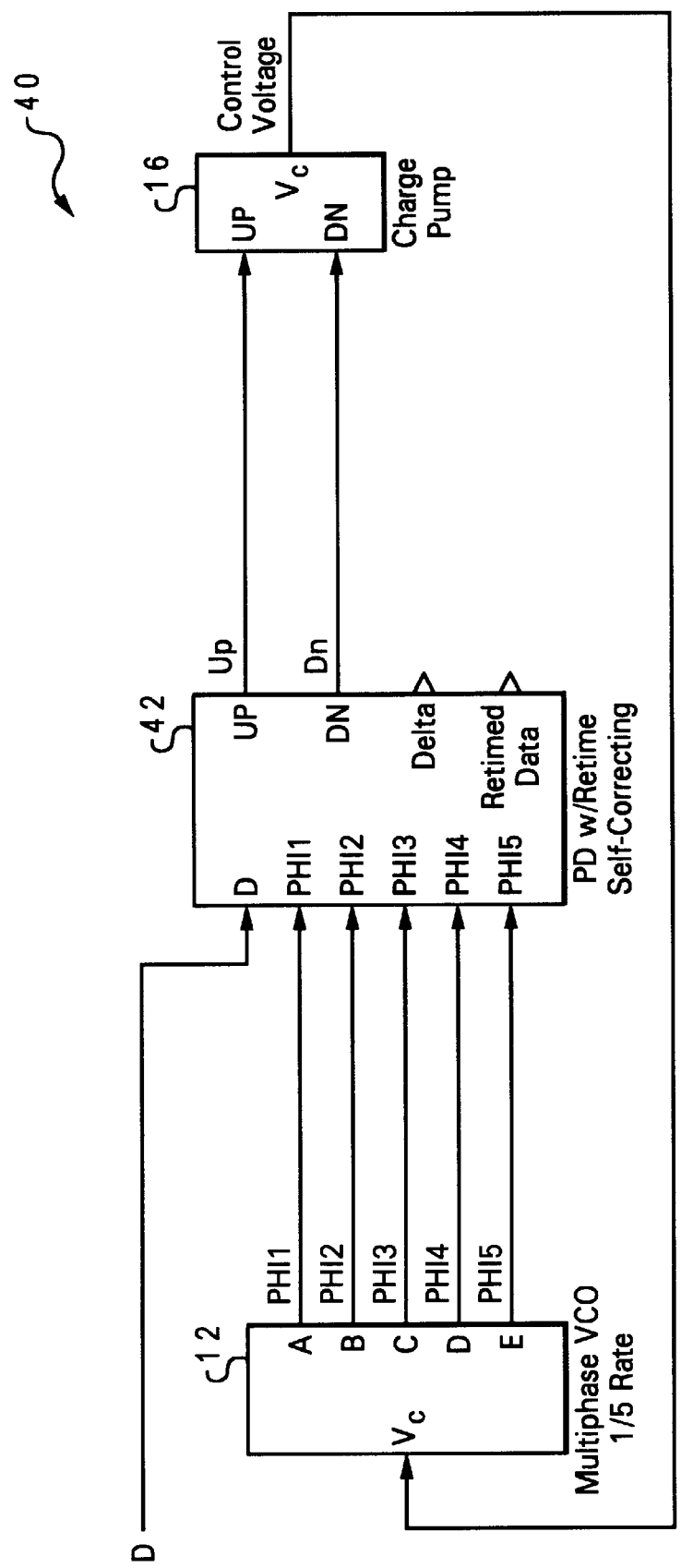
FIG. 14 is a block diagram of another multiphase phase-lock loop using self-correcting phase detector, in accordance with another embodiment of the present invention.

In the foregoing design, the retiming state is used to select a signal that is indicative of whether the appropriate multiphase clock is early or late with respect to the data signal. In an alternative embodiment, the retiming state is used to sample the data to determine the coarse phase error, and to detect the transition density for further refinement of the phase error determination. This alternative design of a PLL 40 constructed in accordance with the present invention is illustrated in FIG. 14. PLL 40 again uses a 5-phase VCO 12 operating at one GHz, but VCO 12 is now connected to a 5-phase self-correcting phase detector 42 which includes a retiming function, as explained further below. A conventional charge-pump 16 is again used to create a control voltage for VCO 12, from the error signals UP and DN.

Figure 15:
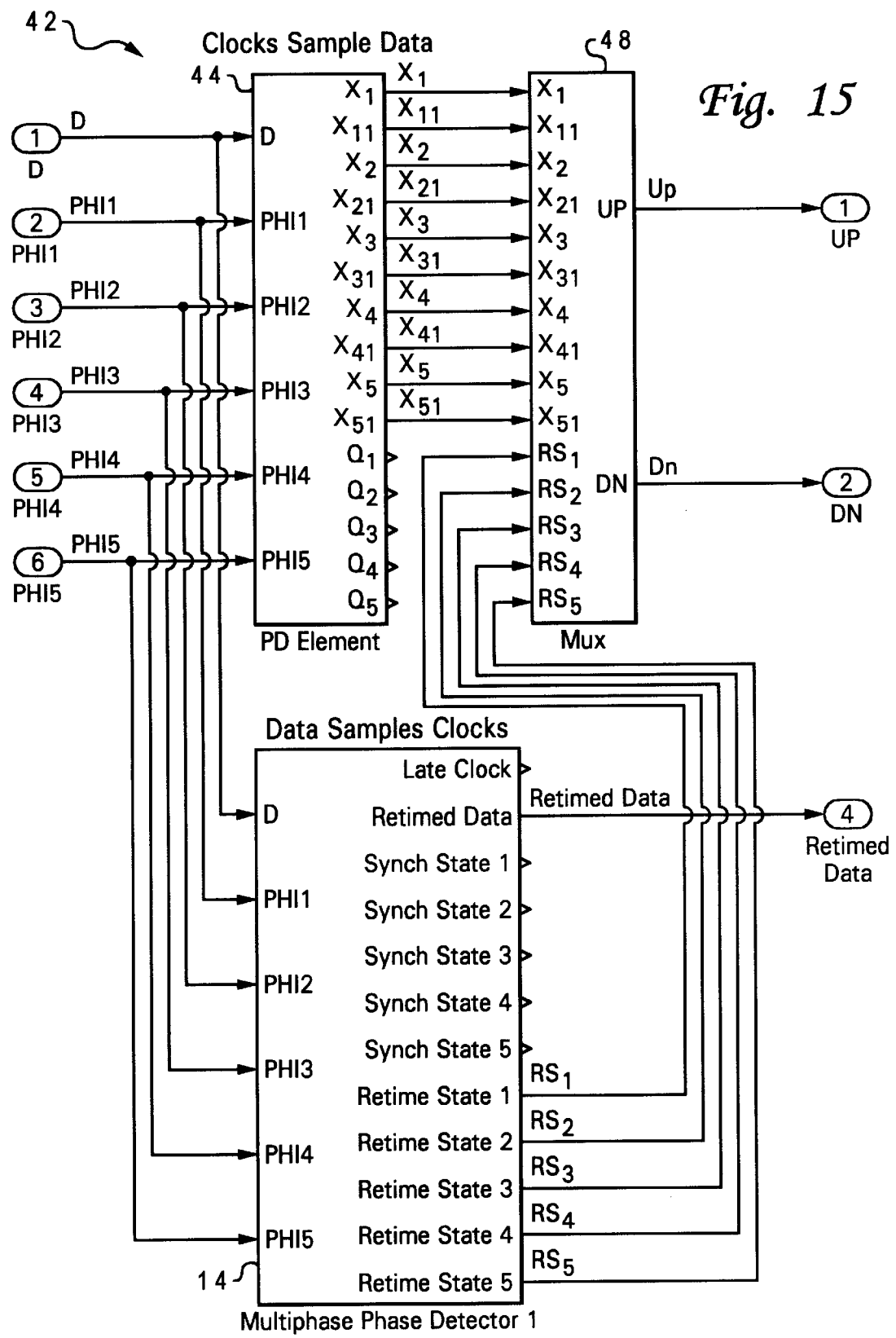
FIG. 15 is a block diagram illustrating the multiphase phase detector used in the phase-lock loop of FIG. 14.

FIG. 15 depicts the high-level organization of self-correcting phase detector 42. Self-correcting phase detector 42 includes a self-correcting unit 44 which uses the clocks to sample data, a multiphase phase-detector 14 which uses data to sample the clock phases and generate SynchStates and RetimeStates, and a multiplexor 48. The details of multiphase phase detector 14 may be understood with reference to FIGS. 9–13. Self-correcting unit 44 provides 5 sets of UP/DN signals, one of which is selected by multiplexor 48 to pass on to charge pump 16, as explained further below.

Figure 16:
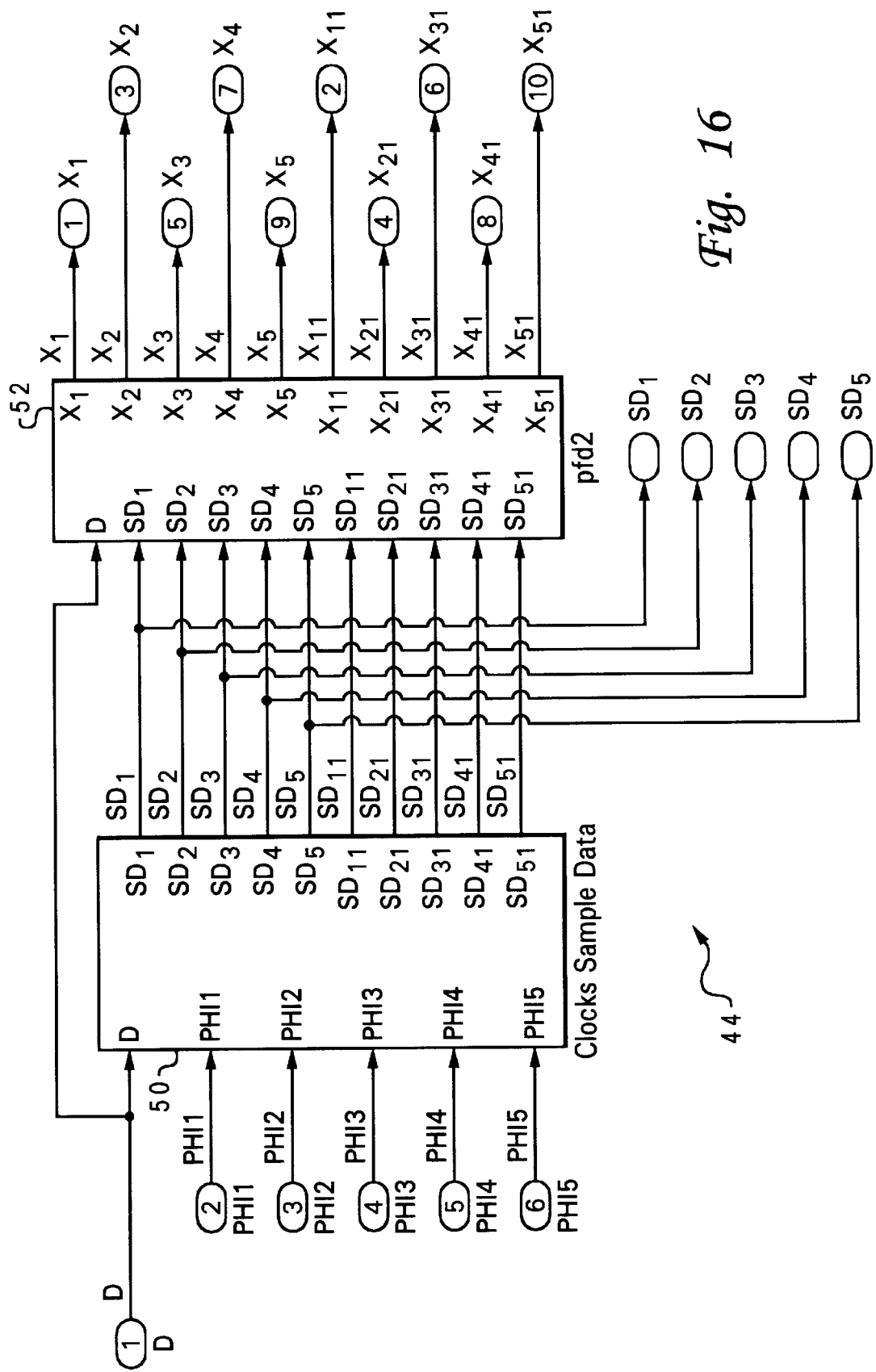
FIG. 16 is a block diagram of a self-correcting unit used by the multiphase phase detector of FIG. 15.
Figure 17:
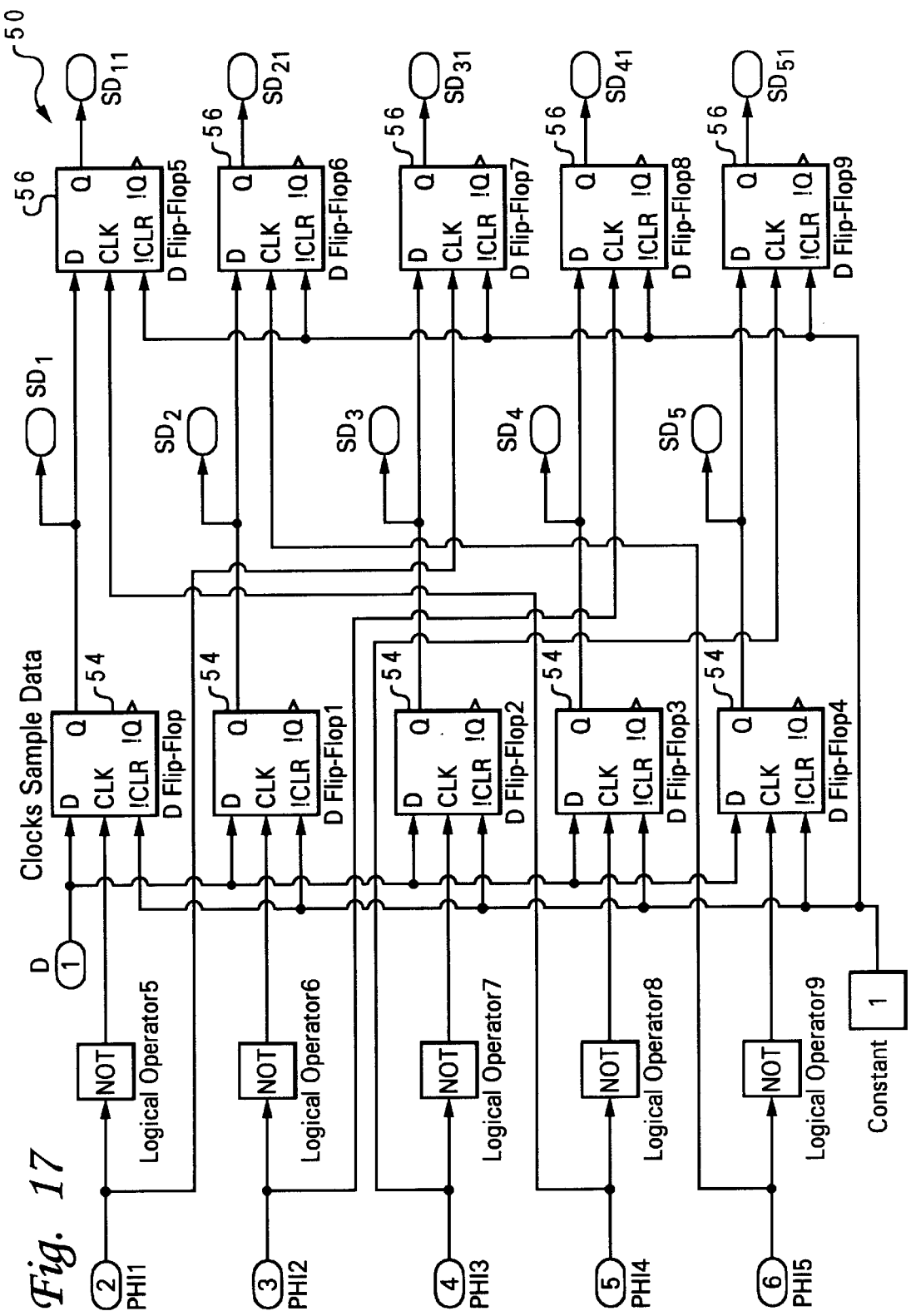
FIG. 17 is a block diagram of a sampled data unit used in the self-correcting unit of FIG. 16.

Self-correcting unit 44 is detailed in FIG. 16, and includes a sampled data unit 50, and an XOR gate array 52. Sampled data unit 50 receives the data signal and the clock signals as inputs, and has 10 outputs which are further illustrated in FIG. 17. Sampled data unit 50 provides the clock sampling of the data function which provides the signals $SD_n$ and $SD_{n1}$ as described earlier (e.g., negative transition of $\emptyset_2$ samples D, positive transition of $\emptyset_5$ samples $SD_2$). The data is sampled by providing the inverted multiphase clock signals to a first set of five flip-flops 54, respectively, and providing non-inverted clock signals to a second set of five flip-flops 56, respectively. Each of the flip-flops also receives either a data signal D or a sampled data signal $SD_n$.

Figure 18:
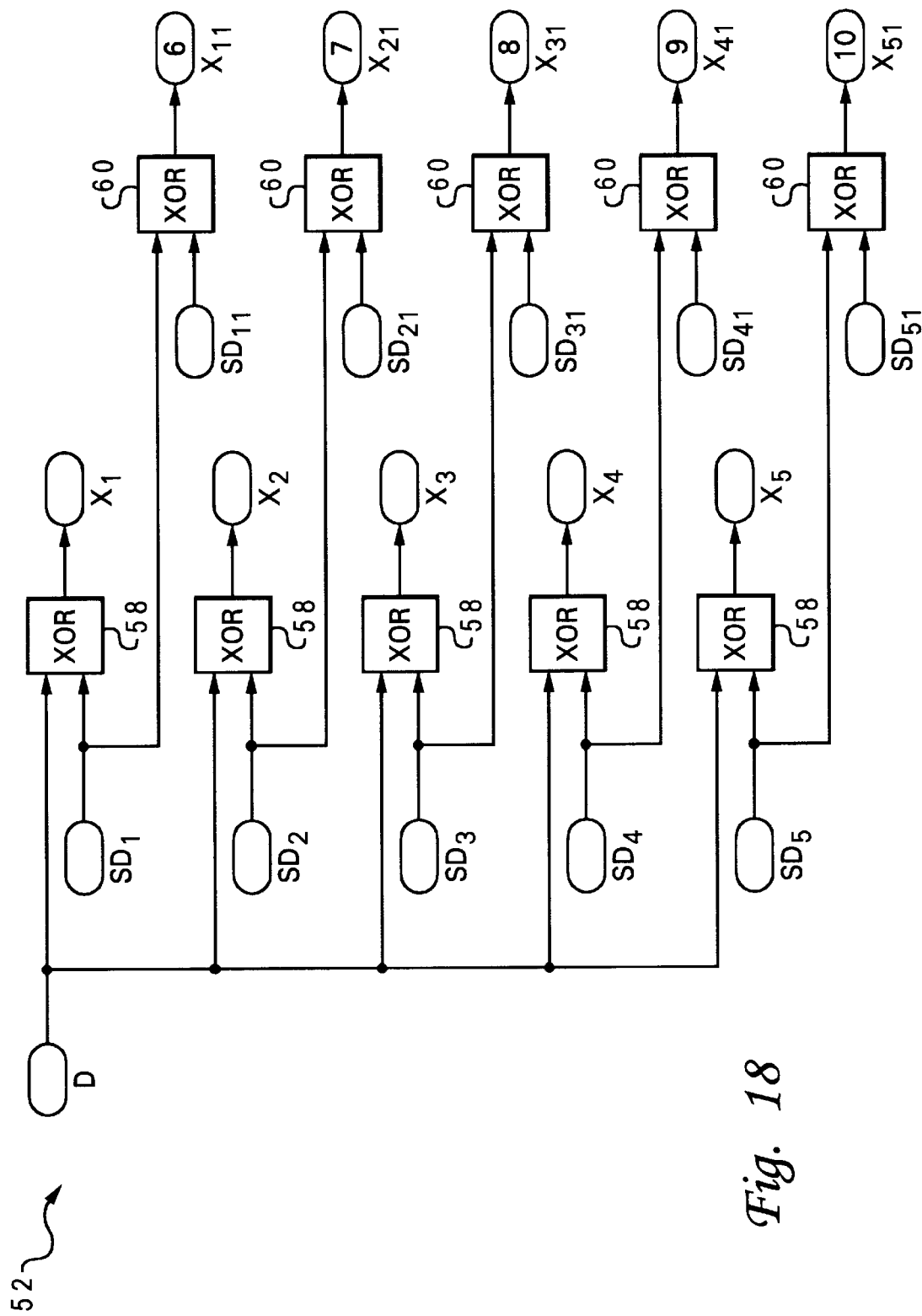
FIG. 18 is a block diagram of an XOR gate array used in the self-correcting unit of FIG. 16.
Figure 19:
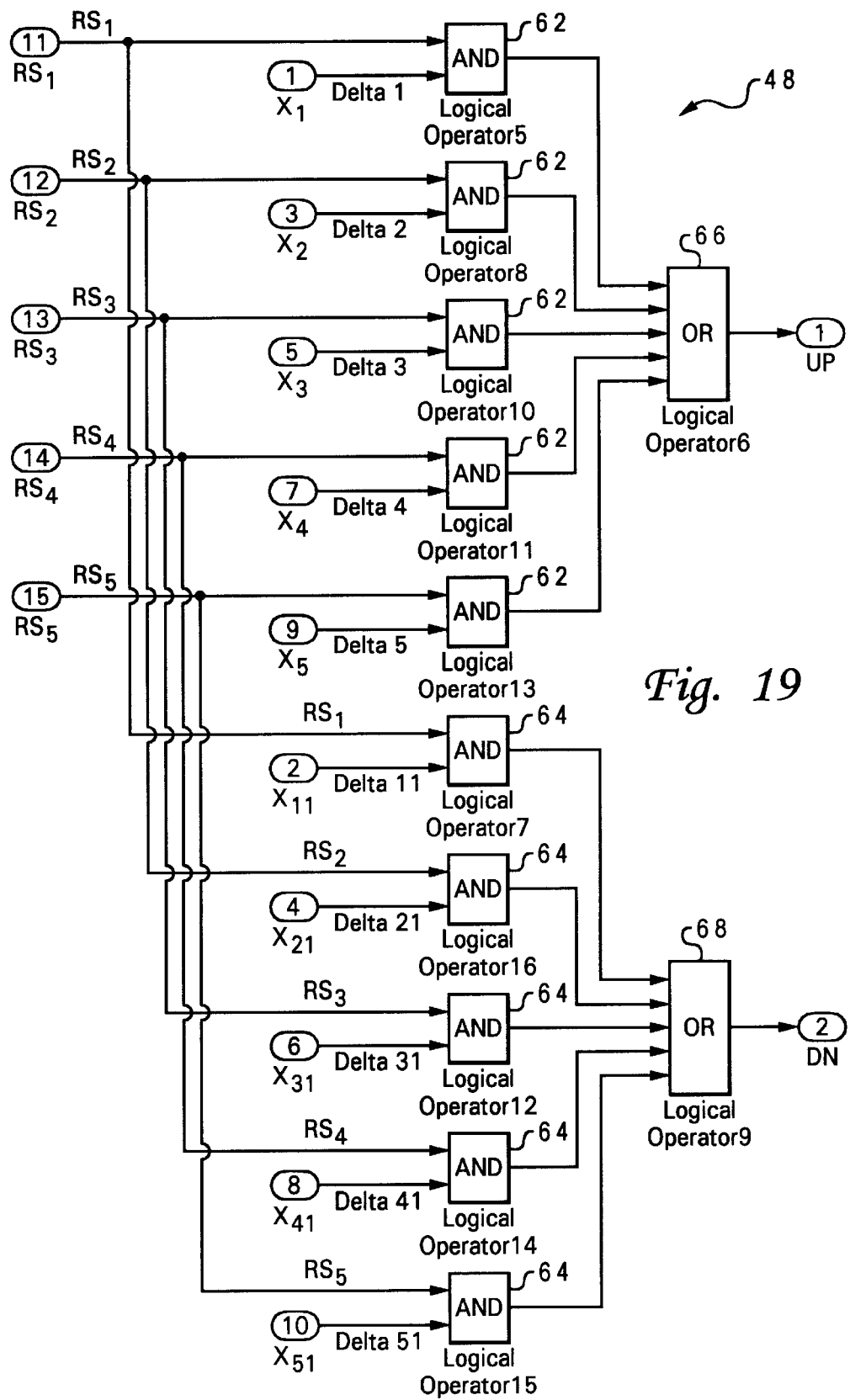
FIG. 19 is a block diagram of the multiplexor used by the multiphase phase detector of FIG. 15.

The outputs of sampled data unit 50 are fed as inputs to XOR gate array 52, which is further depicted in FIG. 18. XOR gate array 52 uses these inputs to provide a set of 10 signals referred to herein as $X_n$ and $X_{n1}$, which are further explained below. The first five $SD_n$ values (from flip-flops 54) are respectively combined with the data signal using five XOR gates 58, to result in signals $X_n$. These first five $SD_n$ values are also respectively combined with the second set of five $SD_{n1}$ values (from flip-flops 56) using five more XOR gates 60, to result in signals $X_{n1}$. The $X_n$ and $X_{n1}$ signals are provided to multiplexor 48, which selects $UP_n$ and $DN_n$ in accordance with the current RetimeState $RS_n$. Multiplexor 48 is shown in FIG. 19. Each of the retime state signals is fed to two different AND gates 62 and 64. Each AND gate 62 and 64 also receives a single one of the $X_n$ and $X_{n1}$ signals. The outputs of AND gates 62 are combined by a 5-input OR gate 66, and the outputs of AND gates 64 are combined by another 5-input OR gate 68, to create the UP and DN signals for use by charge-pump 16.

Figure 20:
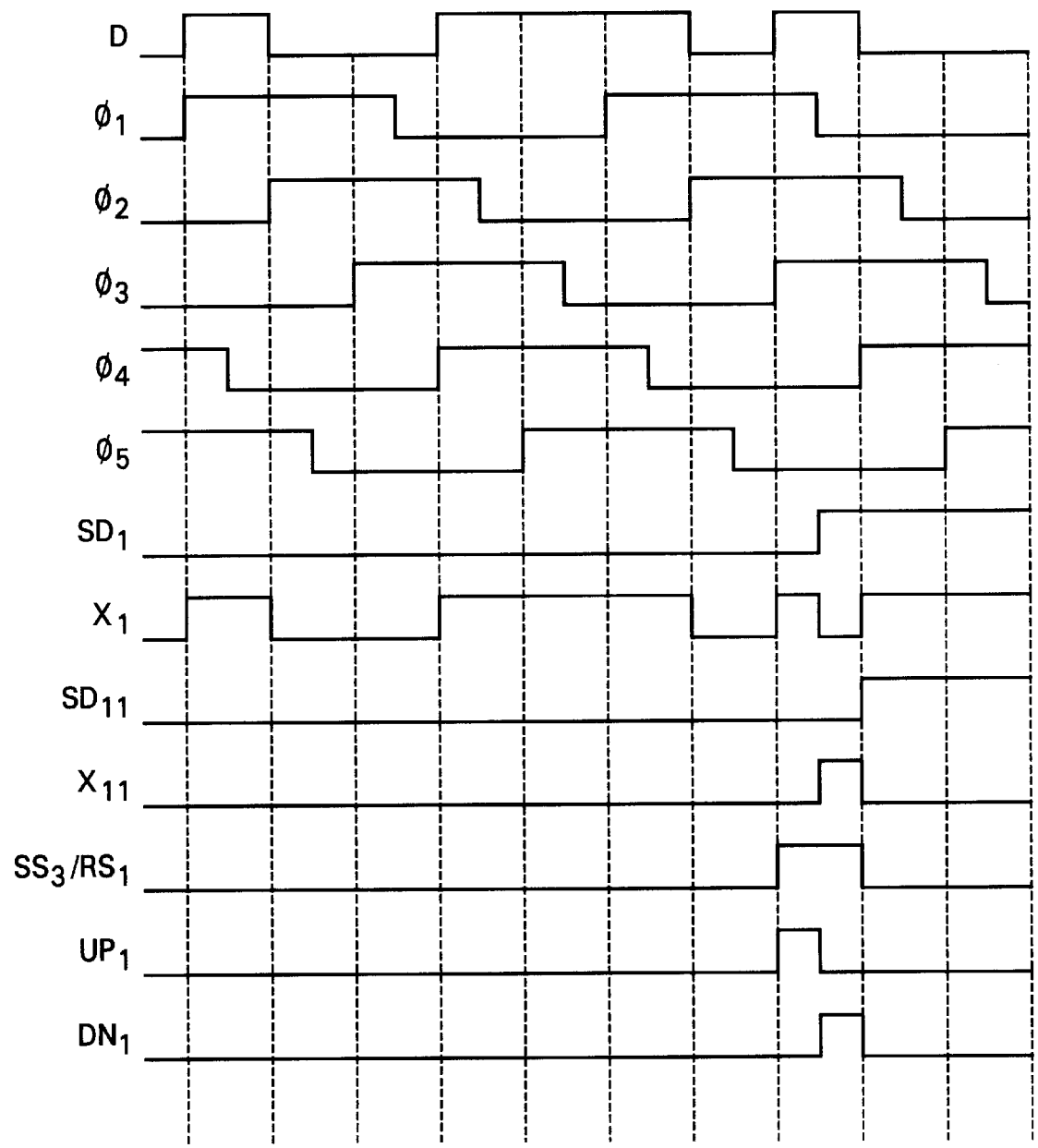
FIG. 20 is a timing diagram illustrating the various signals associated with a "retime state 1" wherein the clock and data are aligned, for the self-correcting implementation of the present invention.
Figure 21:
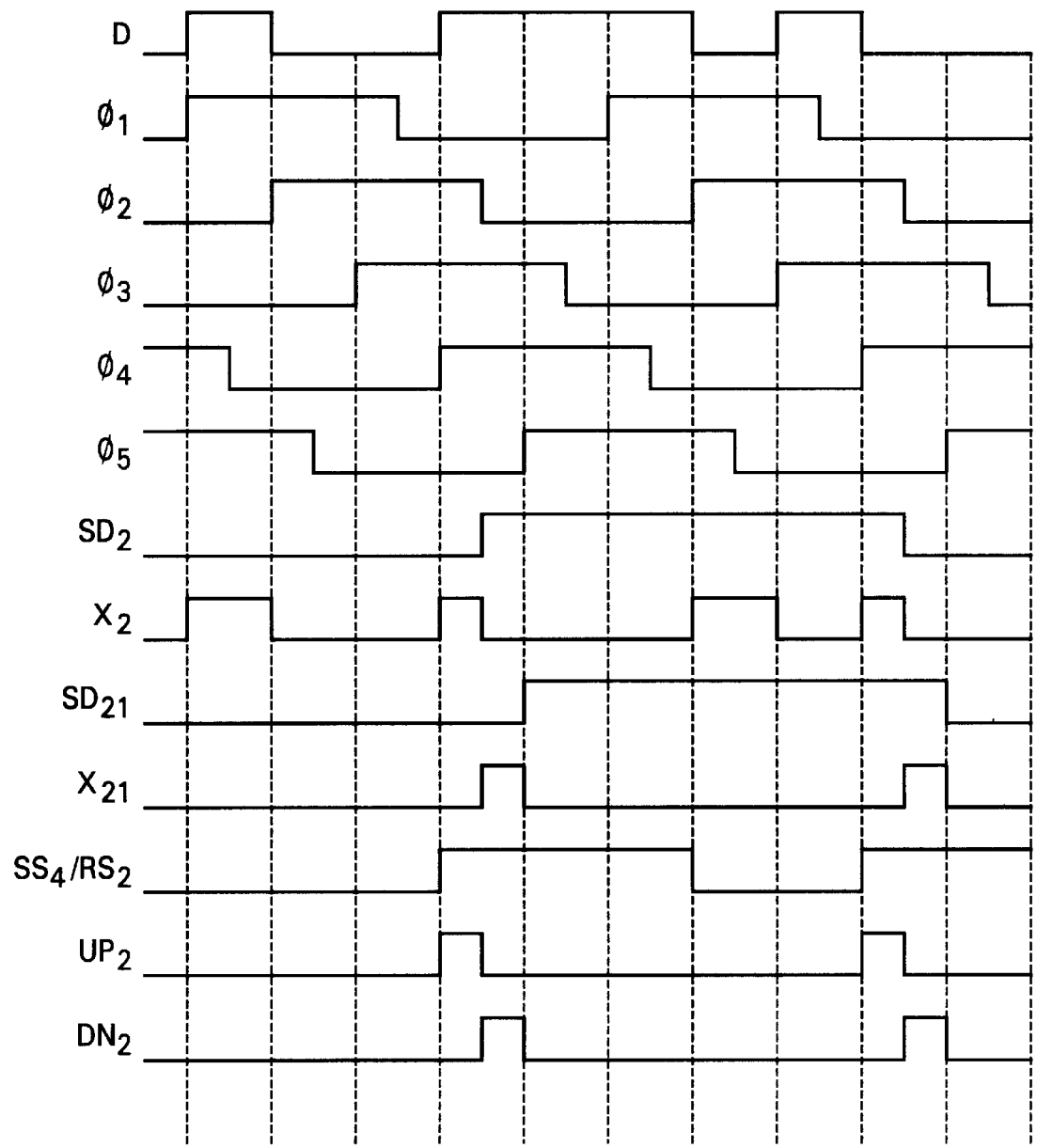
FIG. 21 is a timing diagram illustrating the various signals associated with a "retime state 2" wherein the clock and data are aligned, for the self-correcting implementation of the present invention.
Figure 22:
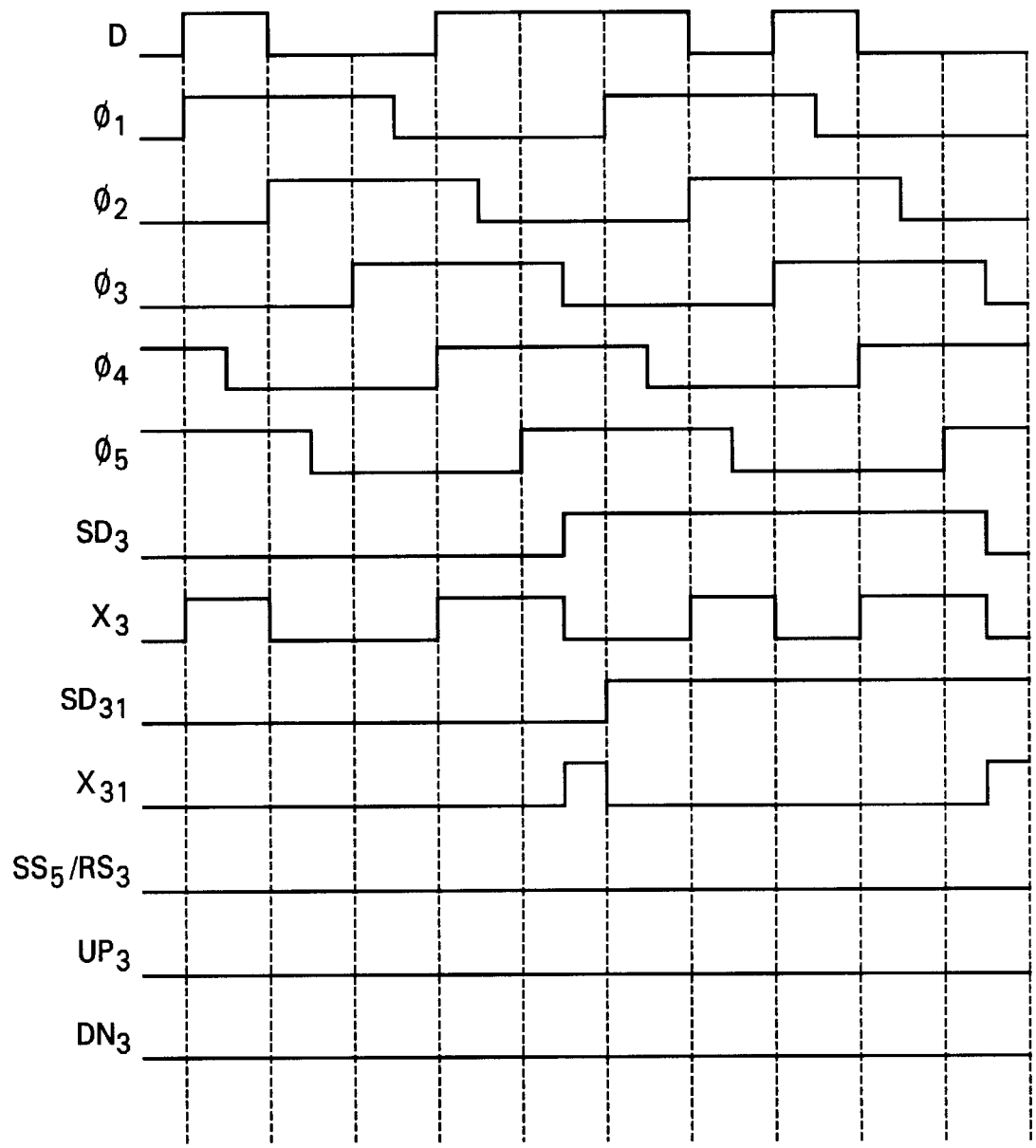
FIG. 22 is a timing diagram illustrating the various signals associated with a "retime state 3" wherein the clock and data are aligned, for the self-correcting implementation of the present invention.
Figure 23:
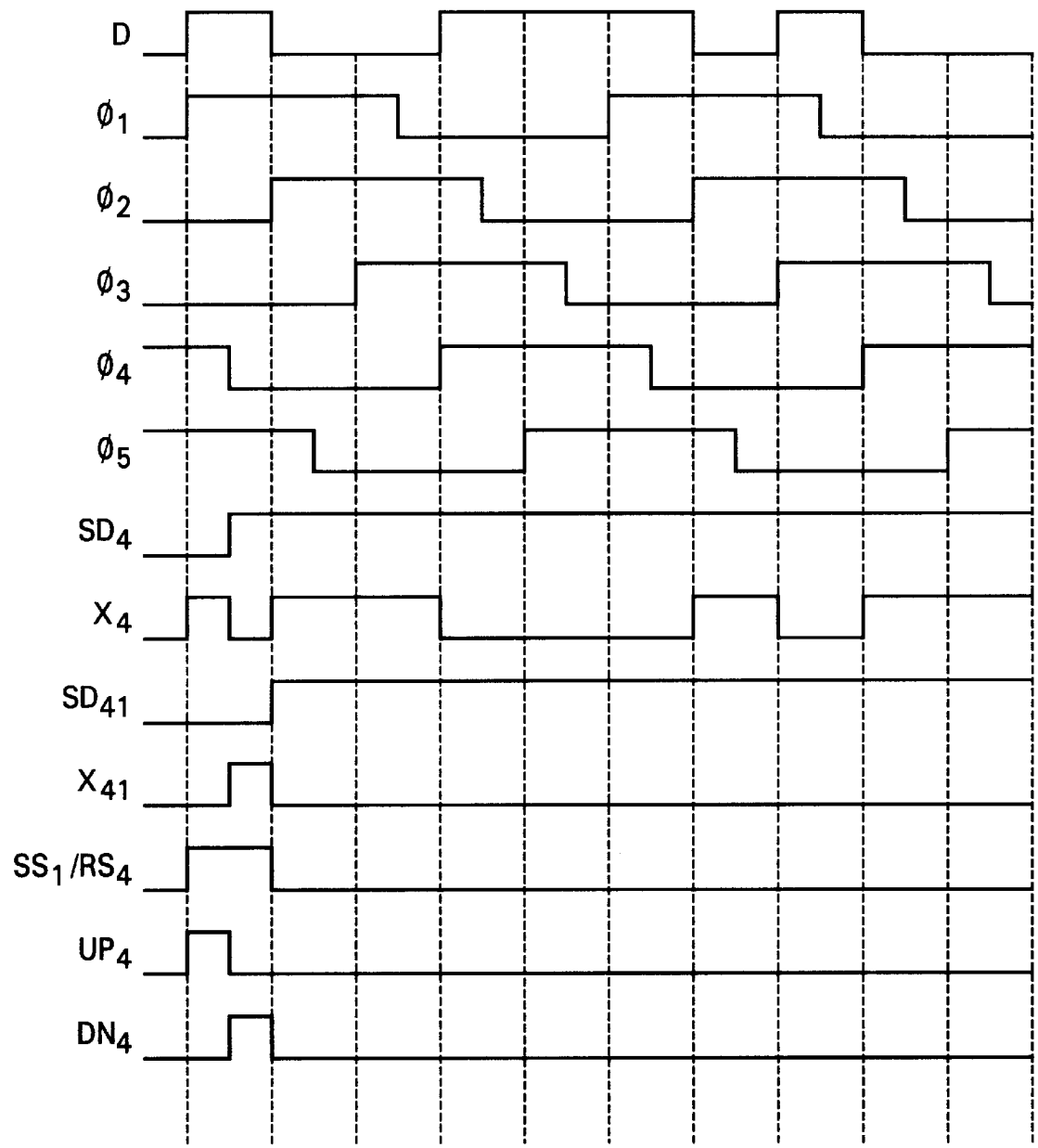
FIG. 23 is a timing diagram illustrating the various signals associated with a "retime state 4" wherein the clock and data are aligned, for the self-correcting implementation of the present invention.
Figure 24:
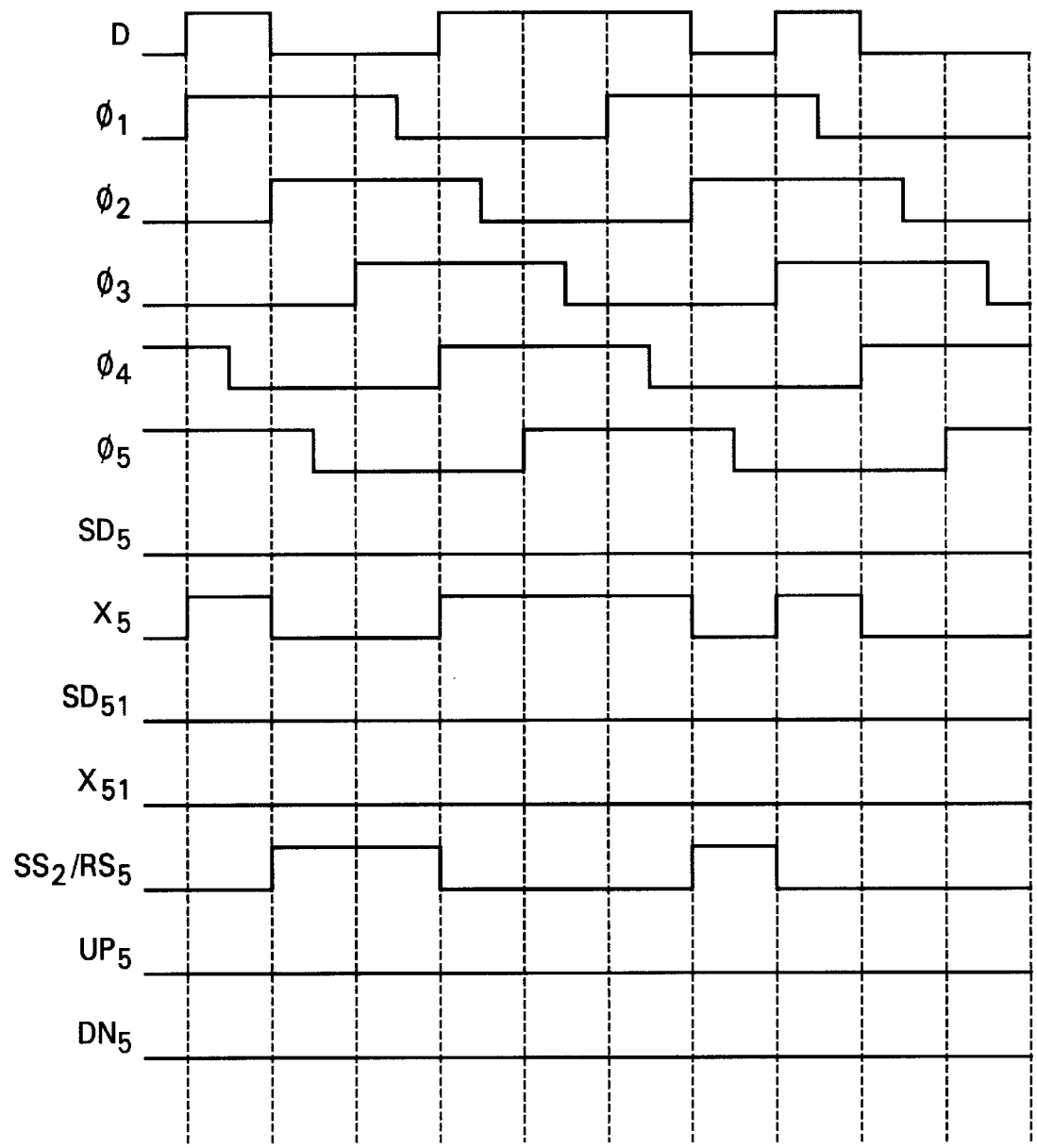
FIG. 24 is a timing diagram illustrating the various signals associated with a "retime state 5" wherein the clock and data are aligned, for the self-correcting implementation of the present invention.

FIG. 20 shows an example of the timing for RetimeState=1 for PLL 40 for the steady state (i.e., clock and data aligned) conditions. The data D is sampled by the negative transitions of $\emptyset_1$ and is held as $SD_1$. $SD_1$ is sampled by the next positive transition of $\emptyset_4$ and is held as $SD_{11}$. An XOR gate compares D with $SD_1$ to create $X_1$ and another XOR gate compares $SD_1$ and $SD_{11}$ to create $X_{11}$. During the time when $RS_1$ is asserted, a change in the state of D from the state of $SD_1$ causes $X_1$ to become asserted until the next negative transition of $\emptyset_1$ causes $SD_1$ and D to be equal again. If the negative transition of $\emptyset_1$ occurs in the center of the baud interval, then $X_1$ will have an average value of 50%. If the data leads the clock the average value will increase; similarly, the average value will decrease for the data lagging the clock. Also during the time when $RS_1$ is asserted (i.e., RetimeState=1), a change in the state of D from the state of $SD_1$ causes $SD_{11}$ to change state on the subsequent positive transition of $\emptyset_4$, asserting $X_{11}$ for exactly one-half of the baud interval/clock phase. In this manner a reference pulse from $X_{11}$ is provided, against which the error pulse from $X_1$ can be compared. Finally, $RS_1$ is AND-ed with $X_1$ and $X_{11}$ to create the $UP_1$ and $DN_1$ signals, respectively. For the steady state case, the areas under $UP_1$ and $DN_1$ are equal; a capacitor charged/discharged from $UP_1/DN_1$ through a charge pump will not register a voltage change over the duration of RetimeState1.

Figure 25:
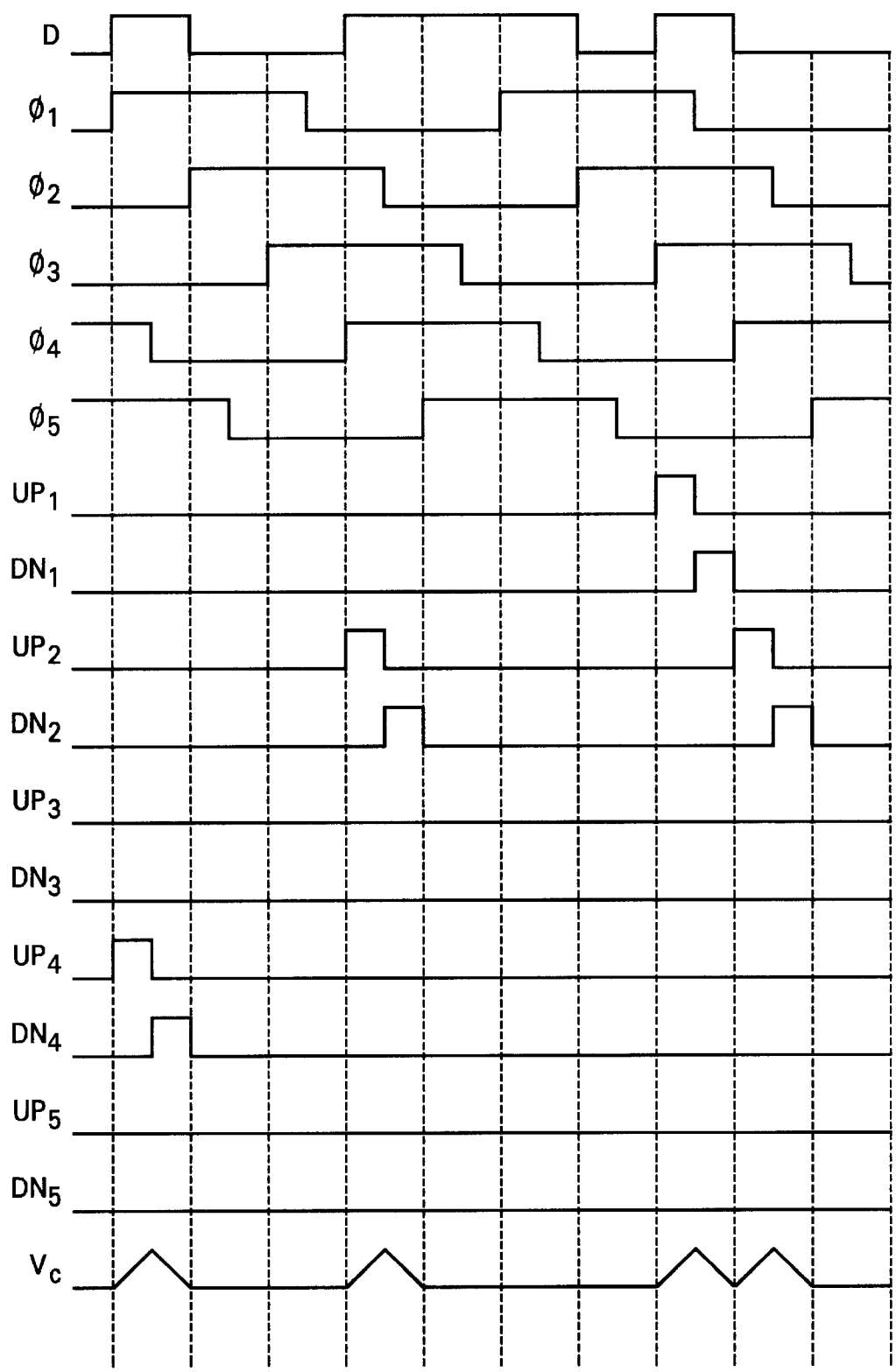
FIG. 25 is a timing diagram illustrating the multiphase clock signals and error correction signals wherein the clock and data are aligned, for the self-correcting implementation of the present invention.
Figure 26:
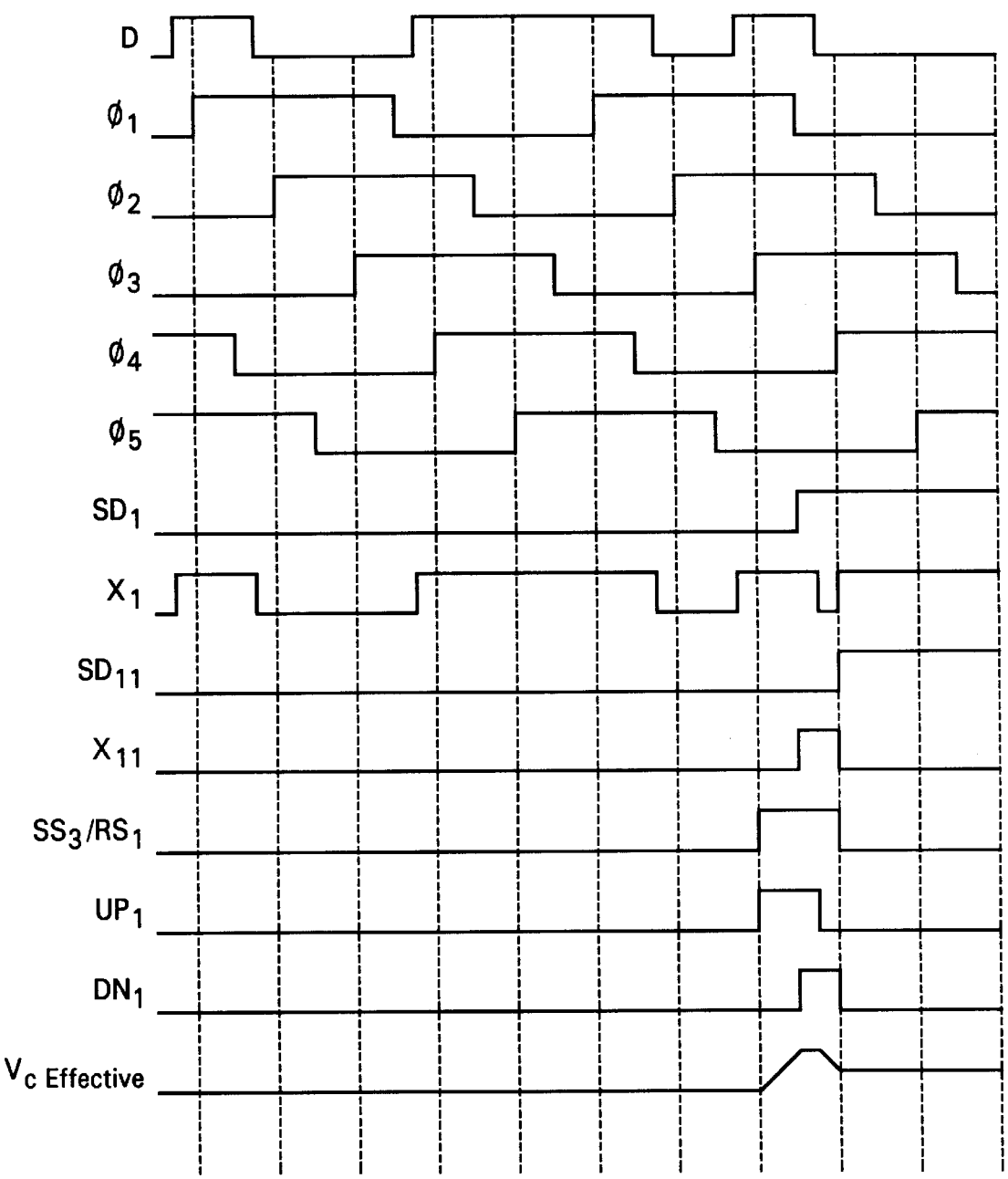
FIG. 26 is a timing diagram illustrating the multiphase clock signals and error correction signals wherein the clock and lags the data (for retime state 1), for the self-correcting implementation of the present invention.
Figure 27:
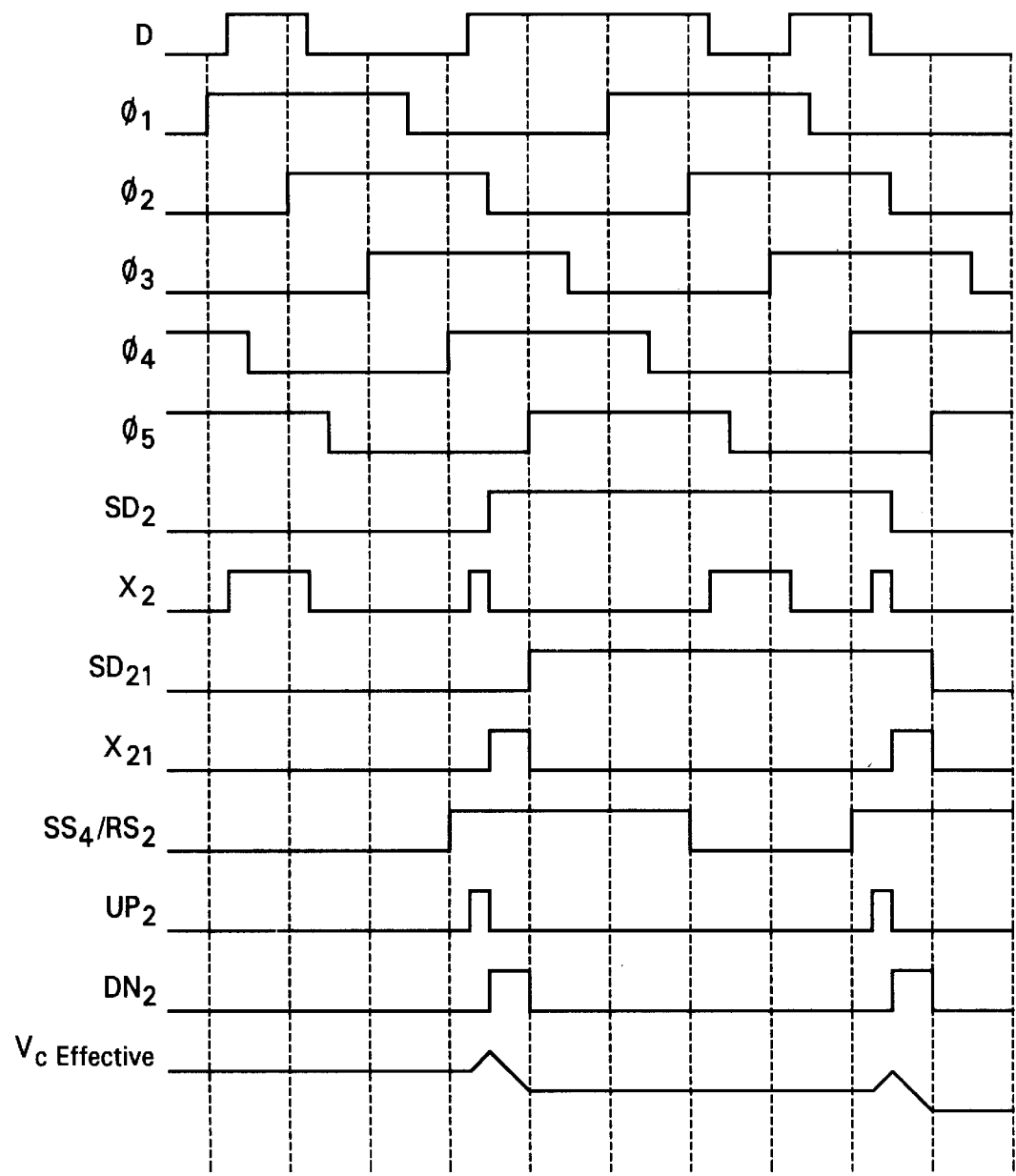
FIG. 27 is a timing diagram illustrating a multiphase clock signals and error correction signals where the clock leads the data (for retime state 2), for the self-correcting implementation of the present invention.

FIGS. 21, 22, 23, and 24 similarly show steady state timing relationships for RetimeStates=2, =3, =4, and =5, respectively. It will be noted that in those figures, the area under $UP_n$ and $DN_n$ are equal for the steady state case. FIG. 25 shows the timing involved with the various $UP_n$ and $DN_n$ signals, and the control voltage after the charge pump. The overall change in control voltage is zero for the steady state case when data and clock are aligned. FIG. 26 shows an example of the timing for RetimeState=1 for the clock lagging the data. Since $\emptyset_1$ should normally have its negative transition in the center of the eye when $RS_1$ is asserted, the average value of $X_1$ increases and $UP_1$ is affected similarly (see FIG. 20). The average values of $X_{11}$ and $DN_1$ remain at 50%. A positive change in control voltage will result from such a phase relationship as shown by "$V_c$ effective" in FIG. 26. FIG. 27 shows an example of the timing for RetimeState=2 for the clock leading the data. Note the corresponding decrease in average value for $X_2$ and $UP_2$ when $RS_2$ is asserted compared to FIG. 21. Again, the average value of $X_{21}$ and $DN_2$ remain at 50%. A negative change in control voltage will result from such a phase relationship as shown by "$V_c$ effective" in FIG. 27.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of effectively extracting a clock signal from a data stream, comprising the steps of:

generating a plurality of multiphase clock signals;

creating a plurality of error signals, at least one error signal for each of the multiphase clock signals, using the data stream;

selecting at least one of the error signals based on a plurality of retime state signals;

correcting the multiphase clock signals using the at least one selected error signal to produce corrected multiphase clock signals; and sampling the data stream using one of the corrected multiphase signals to produce a retimed data signal.

2. The method of claim 1 wherein said generating step generates the multiphase clock signals which are subharmonics of the data stream.

3. The method of claim 1 wherein:

said creating step creates, for each of the multiphase clock signals, an UP error signal and a DN error signal;

said selecting step selects one of the UP error signals and one of the DN error signals; and said correcting step includes the step of applying the selected UP error signal and the selected DN error signal to inputs of a charge pump.

4. The method of claim 3 wherein said generating step generates the multiphase clock signals using a multiphase voltage-controlled oscillator.

5. The method of claim 4 wherein said correcting step further includes the steps of:

generating a control voltage output of the charge pump using the selected UP and DN error signals; and applying the control voltage output of the charge pump to an input of the multiphase voltage-controlled oscillator.

6. The method of claim 1 further comprising the step of selecting the corrected multiphase signal for said sampling step based on a plurality of synchronization states identifying which of the multiphase clock signals is most closely aligned with the data stream.

7. The method of claim 6 wherein:

each of the multiphase clock signals has at least one rising edge; and said step of selecting the corrected multiphase signal includes the step of using the synchronization states to define which of the rising edges of the multiphase clock signals is most closely aligned with an edge of the data stream.

8. The method of claim 7 further comprising the step of defining the retime state signals using the synchronization states.

9. The method of claim 8 wherein said sampling step further comprises the steps of:

inverting the multiphase clock signals to produce inverted phase signals;

combining respective pairs of the retime state signals and the inverted phase signals using a plurality of respective AND gates;

combining the outputs of the AND gates using an OR gate; and latching the output of the OR gate using the data stream to produce the retimed data signal.

10. A circuit for effectively extracting a clock signal from a data stream, comprising:

means for generating a plurality of multiphase clock signals;

means for creating a plurality of error signals, at least one error signal for each of the multiphase clock signals, using the data stream;

means for selecting at least one of the error signals based on a plurality of retime state signals;

means for correcting the multiphase clock signals using the at least one selected error signal to produce corrected multiphase clock signals; and means for sampling the data stream using one of the corrected multiphase signals to produce a retimed data signal.

11. The circuit of claim 10 wherein said generating means generates the multiphase clock signals which are subharmonics of the data stream.

12. The circuit of claim 10 wherein:

said creating means creates, for each of the multiphase clock signals, an UP error signal and a DN error signal;

said selecting means selects one of the UP error signals and one of the DN error signals; and said correcting means applies the selected UP error signal and the selected DN error signal to inputs of a charge pump.

13. The circuit of claim 12 wherein said generating means includes a multiphase voltage-controlled oscillator.

14. The circuit of claim 13 wherein said correcting means further generates a control voltage output of said charge pump using the selected UP and DN error signals, and applies the control voltage output of said charge pump to an input of said multiphase voltage-controlled oscillator.

15. The circuit of claim 10 further comprising means for selecting the corrected multiphase signal for said sampling means based on a plurality of synchronization states identifying which of the multiphase clock signals is most closely aligned with the data stream.

16. The circuit of claim 15 wherein:

each of the multiphase clock signals has at least one rising edge; and said means for selecting the corrected multiphase signal uses the synchronization states to define which of the rising edges of the multiphase clock signals is most closely aligned with an edge of the data stream.

17. The circuit of claim 16 wherein the synchronization states define the retime state signals.

18. The circuit of claim 17 wherein said sampling means:

inverts the multiphase clock signals to produce inverted phase signals;

combines respective pairs of the retime state signals and the inverted phase signals using a plurality of respective AND gates;

further combines outputs of said AND gates using an OR gate; and latches an output of said OR gate using the data stream to produce the retimed data signal.

* * * * *